(12) United States Patent
Ellis et al.

(10) Patent No.: US 7,240,420 B1
(45) Date of Patent: Jul. 10, 2007

(54) SYSTEM AND METHOD FOR POST-FABRICATION REDUCTION OF MINIMUM FEATURE SIZE SPACING OF MICROCOMPONENTS

(75) Inventors: Matthew D. Ellis, Allen, TX (US); Eric G. Parker, Wylie, TX (US); George D. Skidmore, Plano, TX (US)

(73) Assignee: Zyvex Labs, LLC, Richardson, TX (US)

( * ) Notice: Subject to any disclaimer, the term of this patent is extended or adjusted under 35 U.S.C. 154(b) by 924 days.

(21) Appl. No.: 09/884,205

(22) Filed: Jun. 19, 2001

(51) Int. Cl.
*B81B 5/00* (2006.01)

(52) U.S. Cl. ..................................................... 29/729

(58) Field of Classification Search ................. None
See application file for complete search history.

(56) References Cited

U.S. PATENT DOCUMENTS

| | | | |
|---|---|---|---|
| 3,439,416 A | 4/1969 | Yando | |
| 4,740,410 A | 4/1988 | Muller et al. | |
| 5,645,684 A | 7/1997 | Keller | |
| 5,660,580 A | 8/1997 | Keller | |
| 5,806,152 A | 9/1998 | Saitou | |
| 5,818,748 A | 10/1998 | Bertin | |
| 6,175,170 B1* | 1/2001 | Kota et al. | 310/40 MM |
| 6,392,144 B1* | 5/2002 | Filter et al. | 174/52.4 |
| 6,561,725 B1* | 5/2003 | Ellis et al. | 403/326 |
| 6,872,535 B2* | 3/2005 | Baum | 435/7.1 |
| 2003/0019838 A1* | 1/2003 | Shaw et al. | 216/20 |
| 2004/0084319 A1* | 5/2004 | Cohen | 205/118 |

OTHER PUBLICATIONS

U.S. Appl. No. 09/569,328, Ellis et al.
U.S. Appl. No. 09/569,329, Parker et al.
U.S. Appl. No. 09/569,330, Merkle et al.
U.S. Appl. No. 09/570,170, Ellis et al.
U.S. Appl. No. 09/616,500, Ellis et al.
U.S. Appl. No. 09/643,011, Ellis et al.
Thermal Microactuators for Surface Micromachining Processes, Proceedings of the SPIE, V 2642, p. 10-21, 1995.
A New Pick Up & Release Method by Heating for Micromanipulation, by Fumihito Arai and Toshio Fukuda, Jan. 1997.
Avanced Parts Orientation System Has Wide Application, by H. Hitakawa, Aug. 1988.

(Continued)

*Primary Examiner*—Allan Olsen
(74) *Attorney, Agent, or Firm*—Haynes and Boone, LLP

(57) ABSTRACT

A system and method are disclosed which enable post-fabrication reduction of minimum feature size spacing of microcomponents. A method for producing an assembly of microcomponents is provided, in which at least two microcomponents are fabricated having a separation space therebetween. At least one of the microcomponents includes an extension part that is operable to reduce the separation space. Such an extension part may include an extension member that is movably extendable away from its associated microcomponent to reduce the separation space between its associated microcomponent and another microcomponent. The extension part may be latched at a desired position by a latching mechanism. The extension part may be implemented such that the extension member eliminates the separation space, thereby resulting in such extension member engaging another microcomponent. Such engagement may be achieved without requiring power to be applied to the microcomponents. Certain embodiments are insensitive to etching inaccuracy encountered during fabrication.

37 Claims, 15 Drawing Sheets

OTHER PUBLICATIONS

Design, Fabrication, and Characterization of Single Crystal Silicon Latching Snap Fasteners for Micro Assembly, by Rama Prasad et al., Nov. 1995.

Fluidic Self-Assembly of Microstructures and its Application to the Integration of GaAs on Si, by Hsi-Jen J. Yeh and John S. Smith, Jan. 1994.

Hexsil Tweezers for Teleoperated Microassembly, by C. G. Keller and R. T. Howe, Jan. 1997.

Microassembly Technologies for MEMS, by Michael B. Cohn et al.

Microfabricated High Aspect Ratio Silicon Flexures, by Chris Keller, 1998.

Self-Assembling Electrical Networks: An Application of Micromachining Technology, by Michael B. Cohn et al., May 1991.

Surface-Micromachined Components for Articulated Microrobots, by Richard Yeh, et al., Mar. 1996.

Survey of Sticking Effects for Micro Parts Handling, by Ronald S. Fearing, Apr. 1995.

* cited by examiner

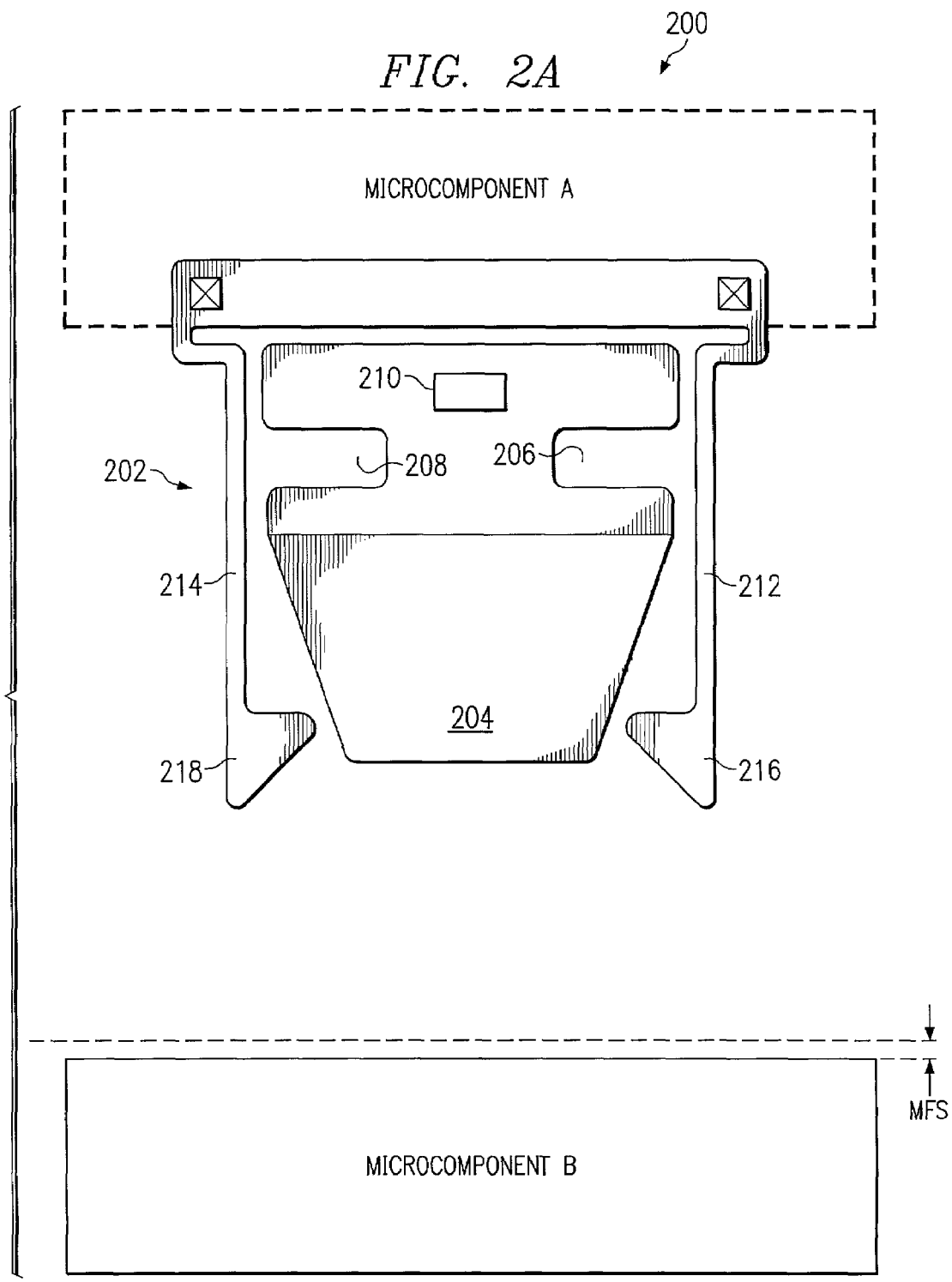

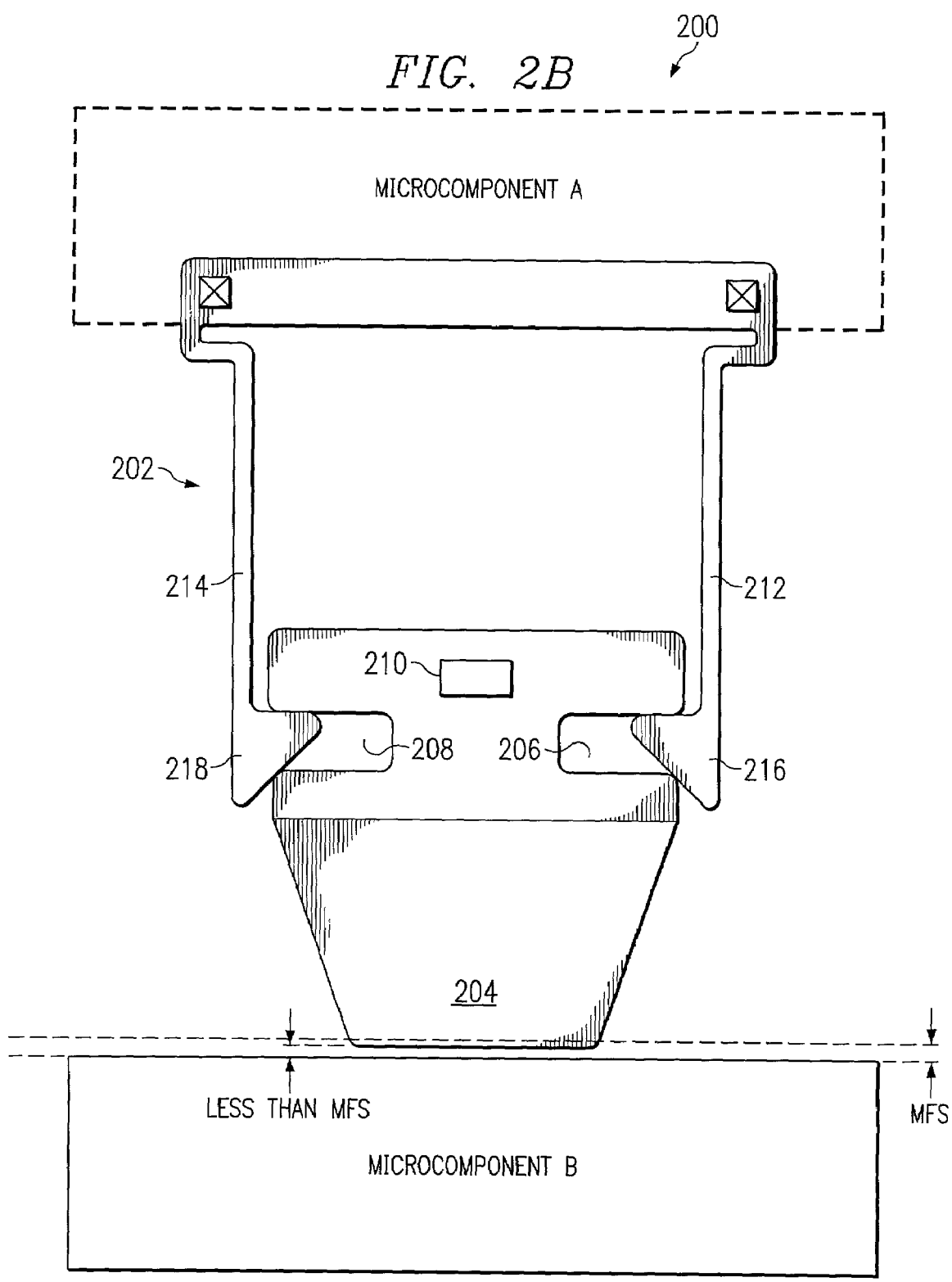

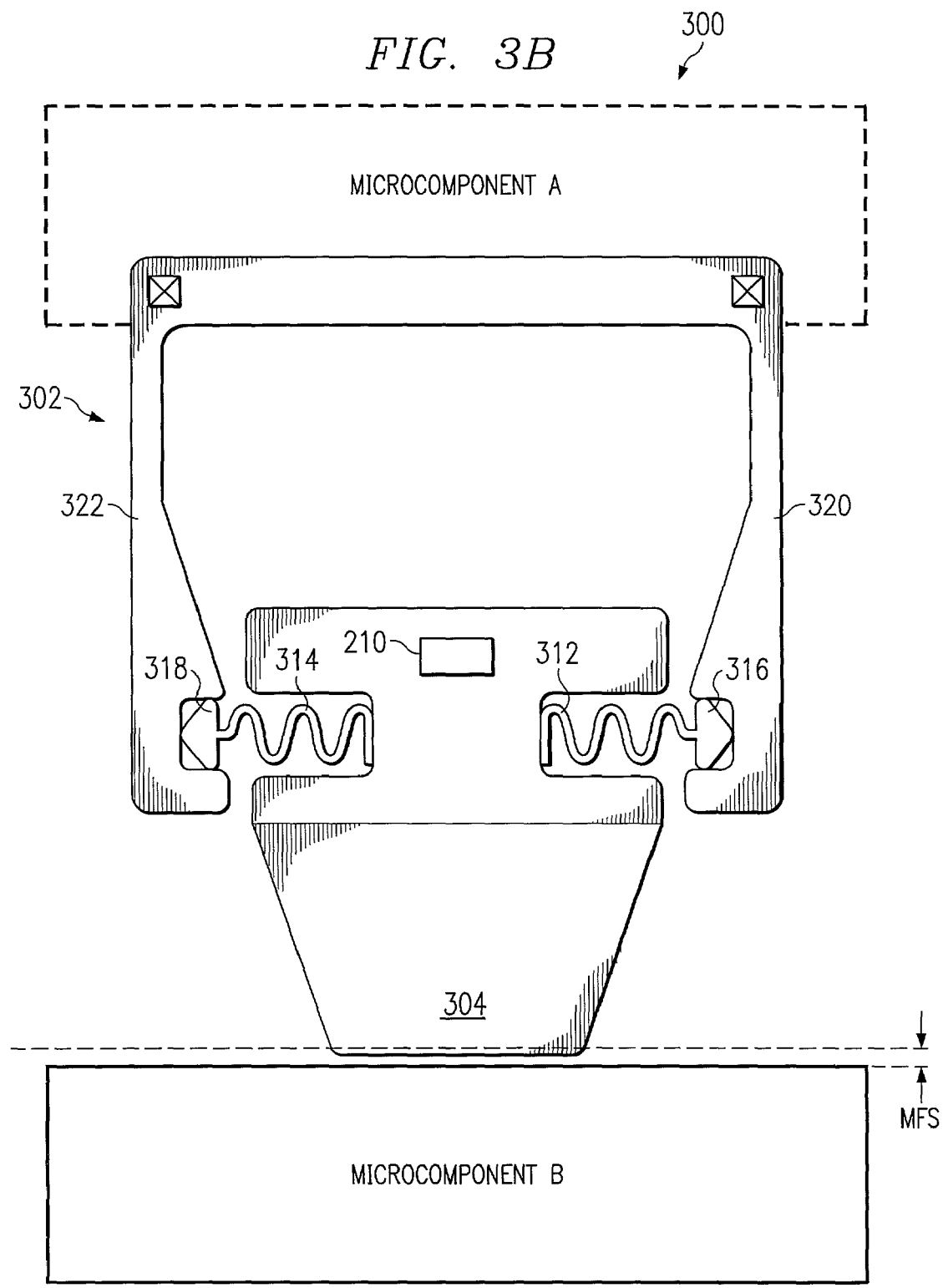

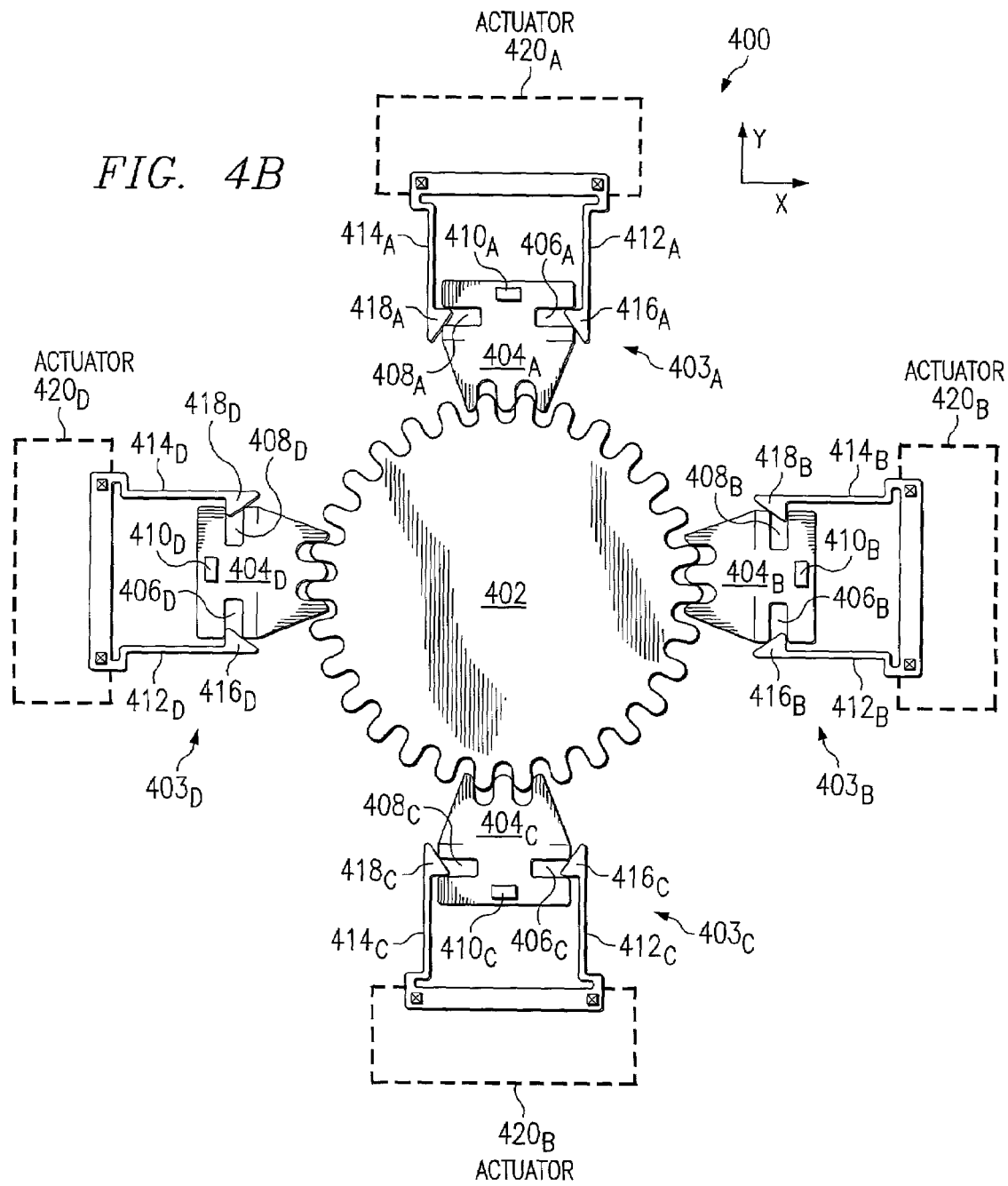

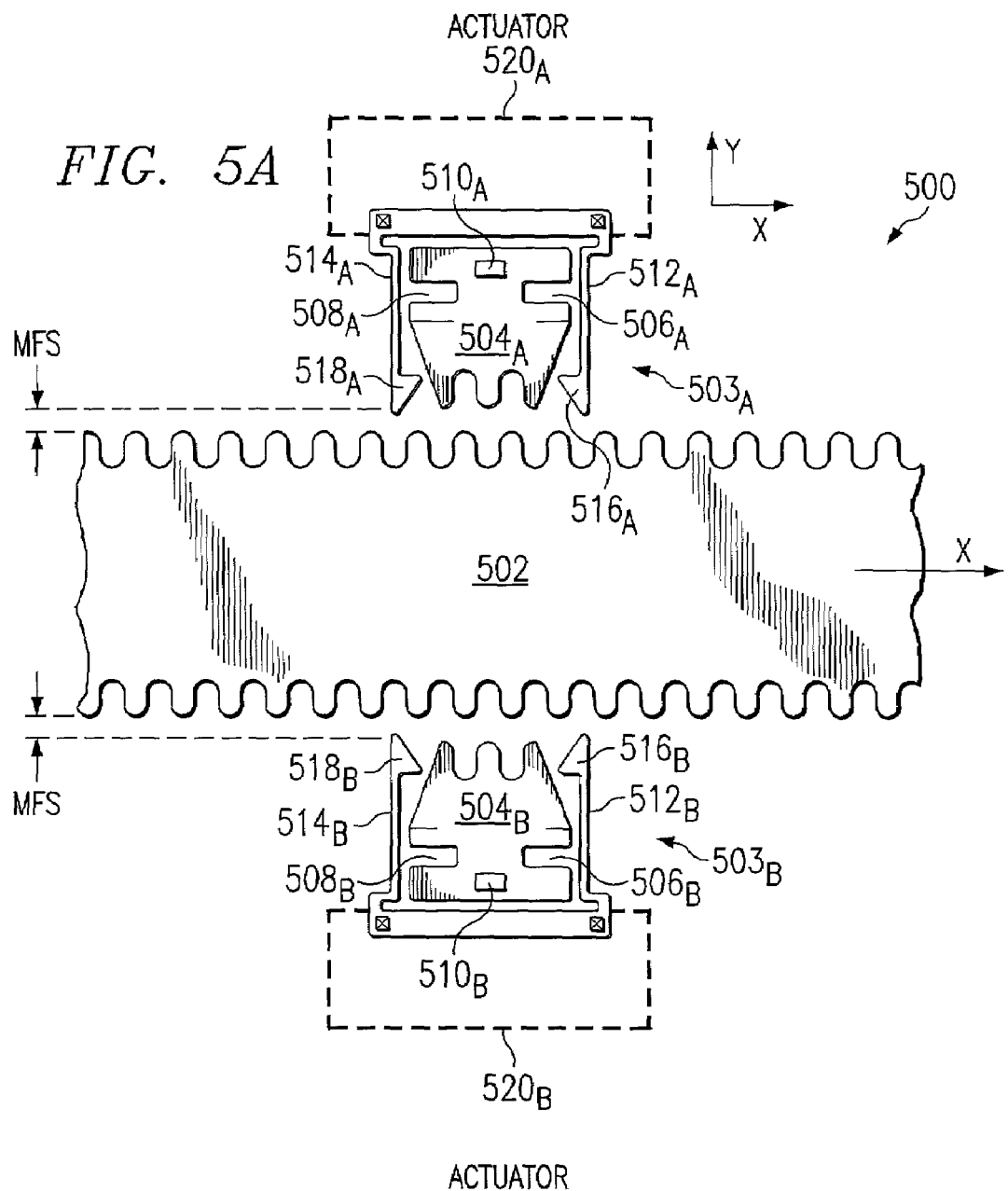

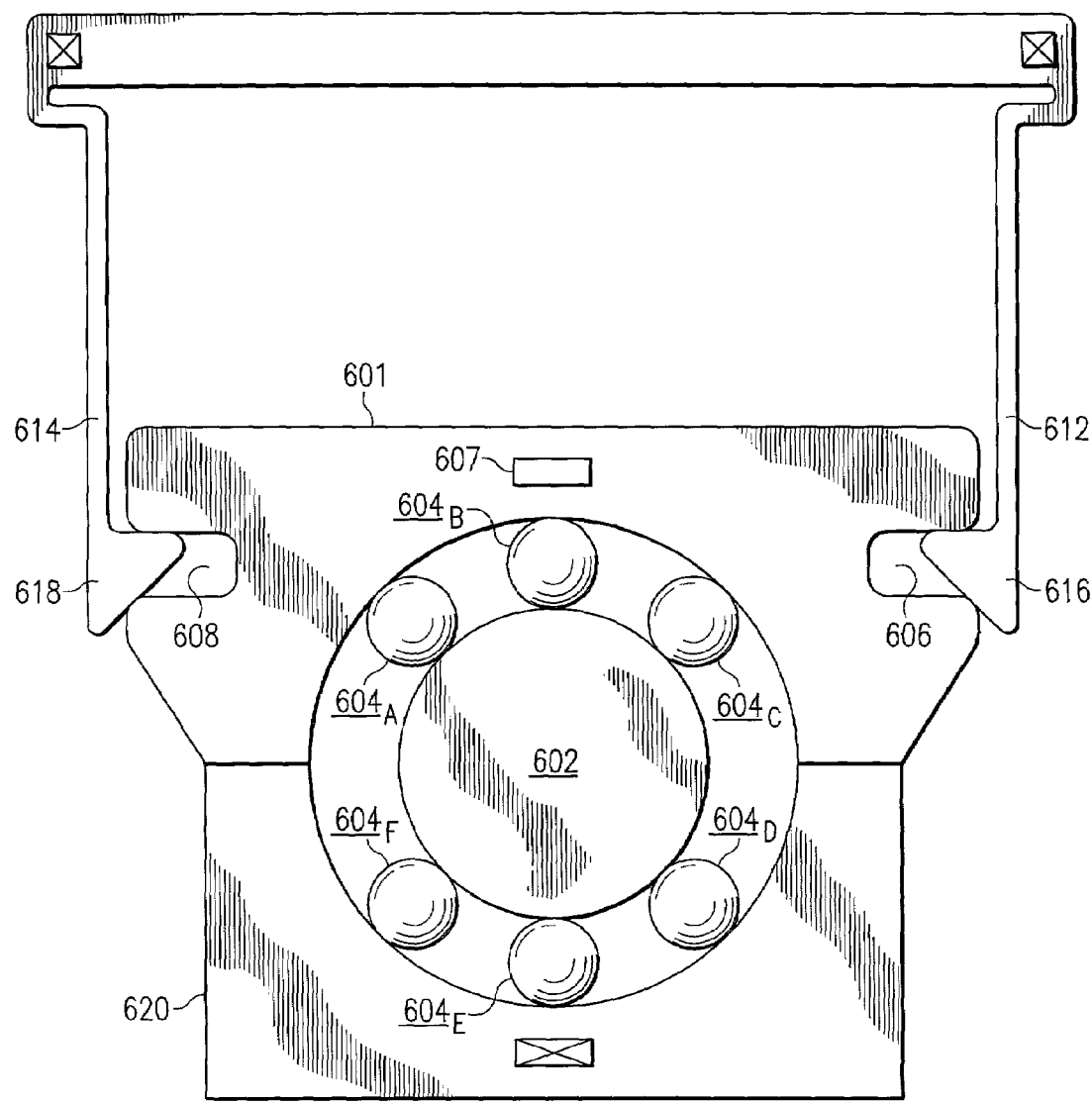

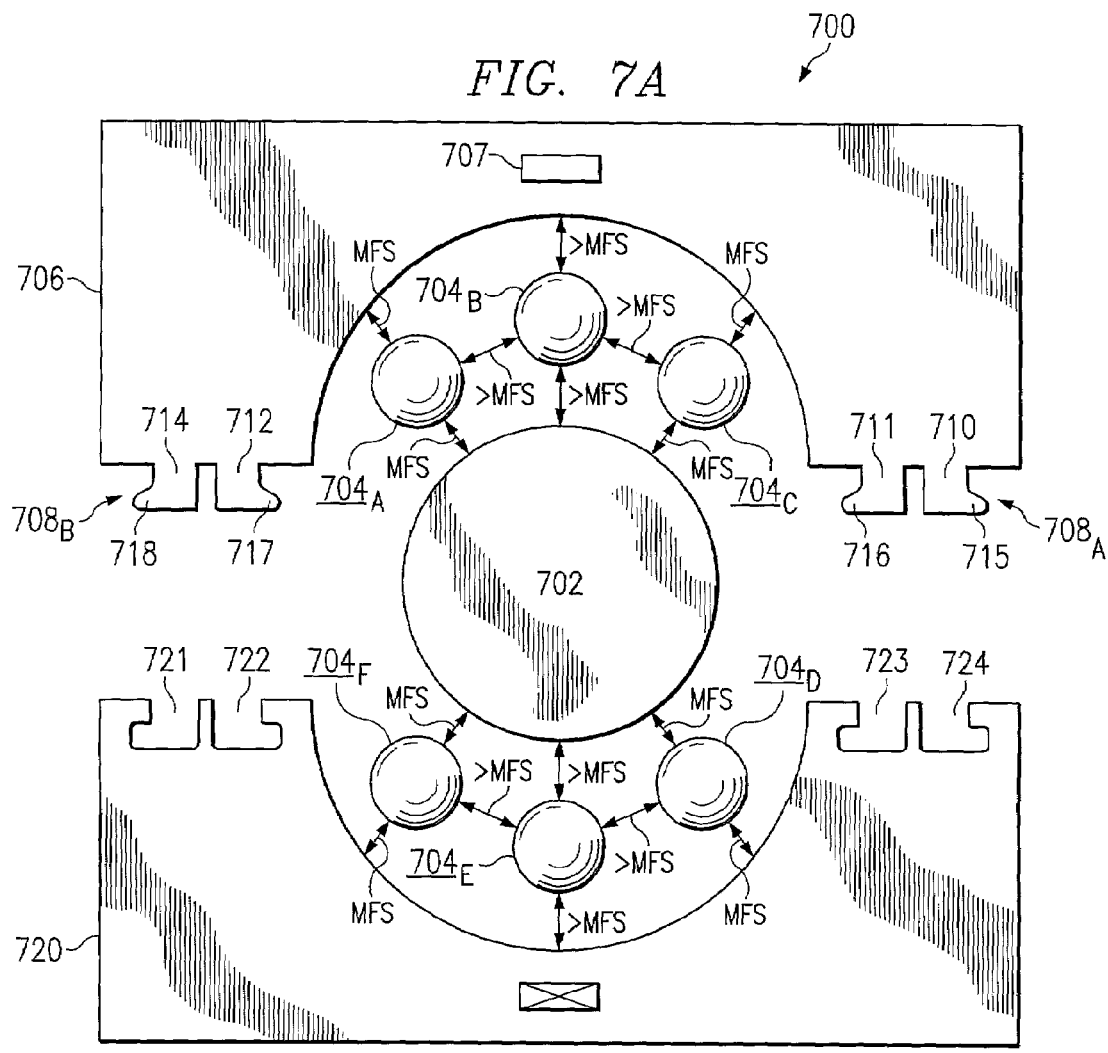

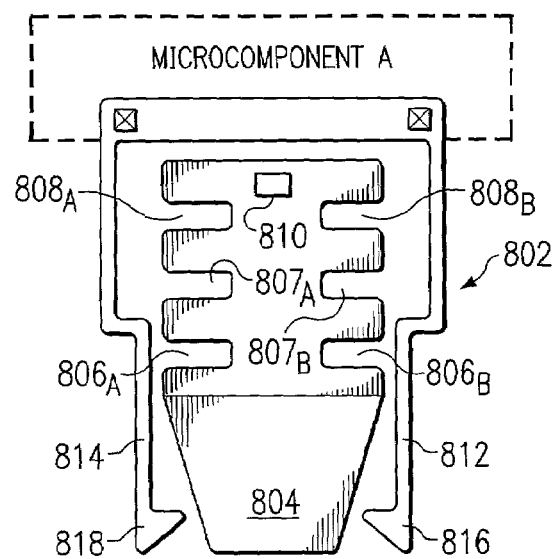
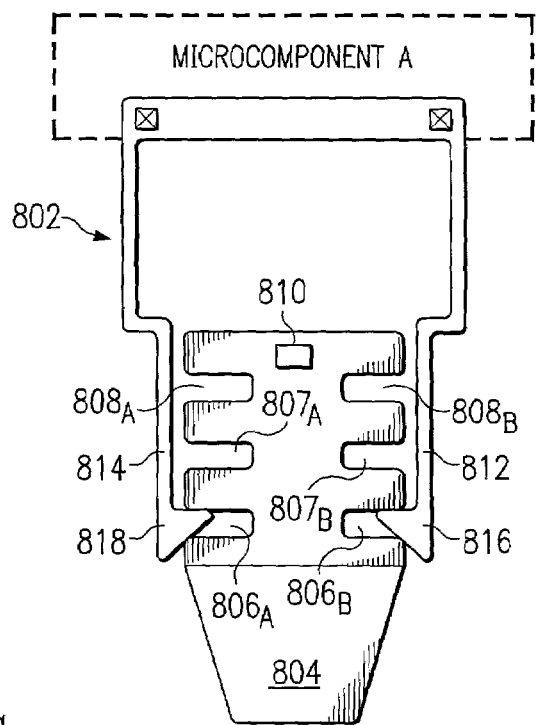
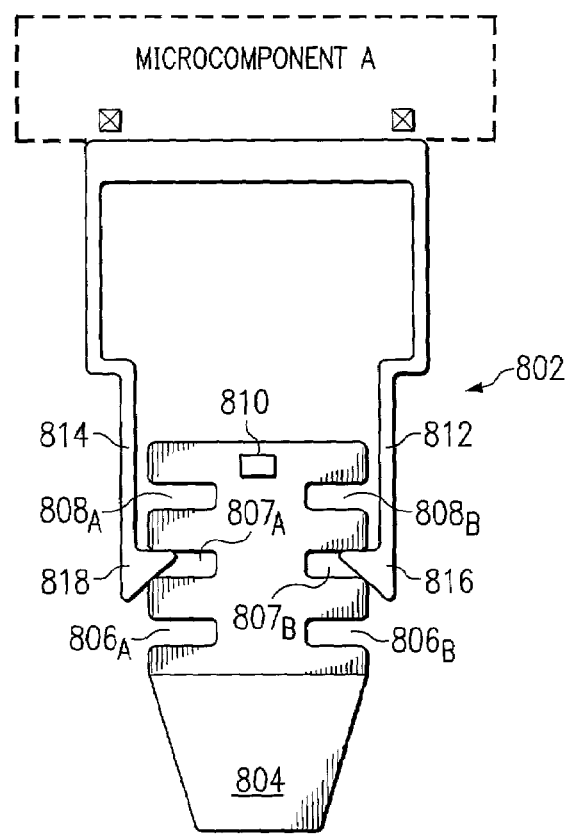

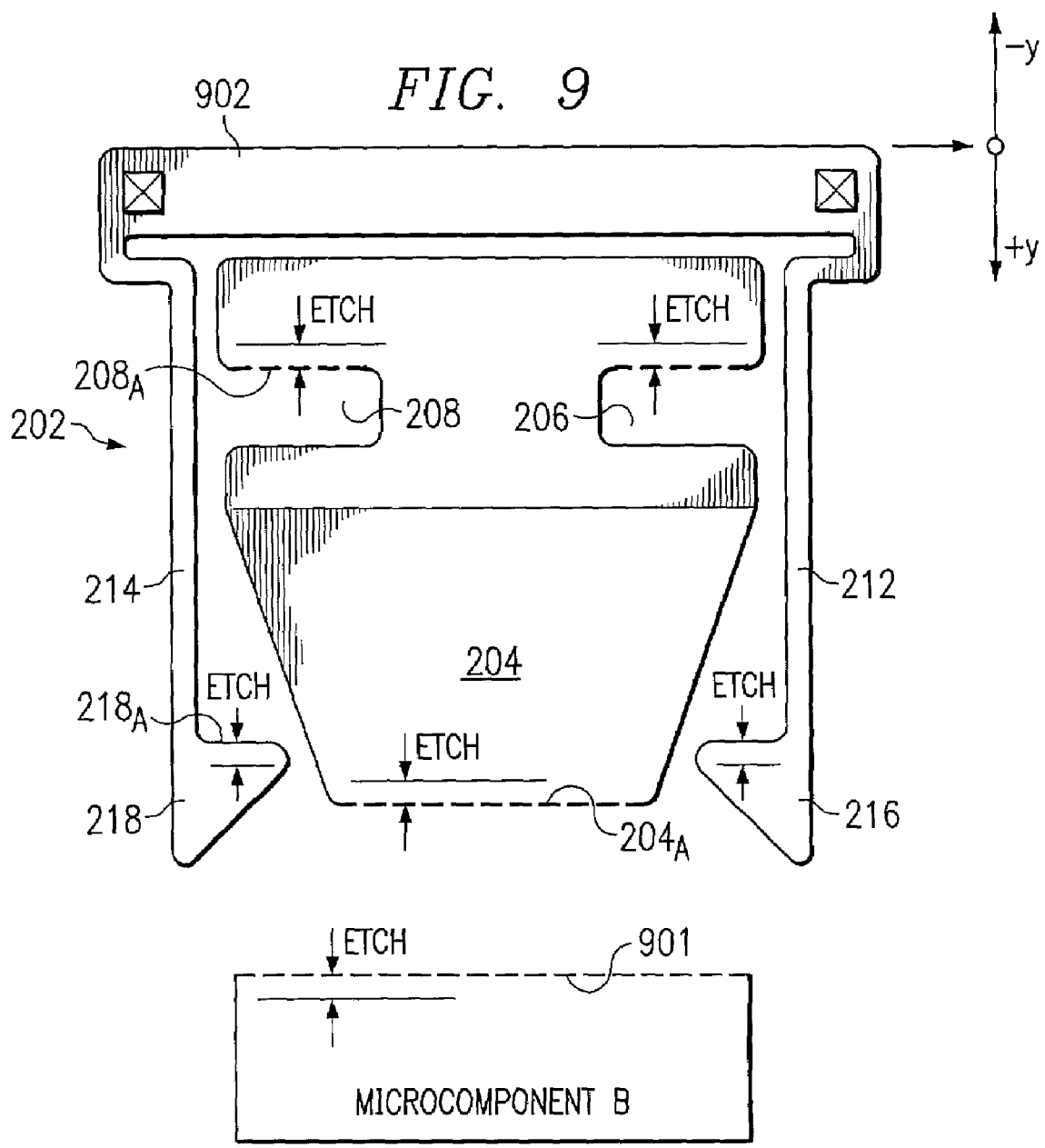

SYSTEM AND METHOD FOR POST-FABRICATION REDUCTION OF MINIMUM FEATURE SIZE SPACING OF MICROCOMPONENTS

RELATED APPLICATIONS

This application is related to co-pending and commonly assigned U.S. patent application Ser. Nos. 09/569,330 entitled "METHOD AND SYSTEM FOR SELF-REPLICATING MANUFACTURING STATIONS" filed May 11, 2000, Ser. No. 09/570,170 entitled "SYSTEM AND METHOD FOR COUPLING MICROCOMPONENTS" filed May 11, 2000, Ser. No. 09/569,329 entitled "GRIPPER AND COMPLEMENTARY HANDLE FOR USE WITH MICROCOMPONENTS" filed May 11, 2000, Ser. No. 09/616,500 entitled "SYSTEM AND METHOD FOR CONSTRAINING TOTALLY RELEASED MICROCOMPONENTS" filed Jul. 14, 2000, Ser. No. 09/569,328 entitled "RIBBON CABLE AND ELECTRICAL SNAP CONNECTOR FOR USE WITH MICROCOMPONENTS" filed May 11, 2000, and Ser. No. 09/643,011 entitled "SYSTEM AND METHOD FOR COUPLING MICROCOMPONENTS UTILIZING A PRESSURE FITTING RECEPTACLE" filed Aug. 21, 2000; the disclosures of which are hereby incorporated herein by reference.

TECHNICAL FIELD

The present invention relates in general to post-fabrication assembly of microcomponents, and in specific to a method and system for post-fabrication reduction/elimination of spacing between microcomponents, such spacing being required during fabrication of microcomponents due, for example, to the minimum feature size required by the particular fabrication process utilized.

BACKGROUND

Extraordinary advances are being made in micromechanical devices and microelectronic devices. Further, advances are being made in MicroElectroMechanical ("MEMs") devices, which comprise integrated micromechanical and microelectronic devices. The terms "microcomponent" and "microdevice" will be used herein generically to encompass microelectronic components, micromechanical components, as well as MEMs components. Generally, microcomponent devices are devices having a size below one millimeter by one millimeter. Although, microcomponents as large as one centimeter by one centimeter have been provided in the prior art. Moreover, microcomponents may be smaller than one millimeter by one millimeter in size.

Various techniques for fabricating microcomponents are known in the prior art, and further fabrication techniques continue to be developed. Examples of fabrication techniques that may be utilized for fabricating microcomponents are further disclosed in co-pending U.S. patent application Ser. No. 09/569,330 entitled "METHOD AND SYSTEM FOR SELF-REPLICATING MANUFACTURING STATIONS" filed May 11, 2000 and co-pending U.S. patent application Ser. No. 09/616,500 entitled "SYSTEM AND METHOD FOR CONSTRAINING TOTALLY RELEASED MICROCOMPONENTS" filed Jul. 14, 2000, the disclosures of which have been incorporated herein by reference. Further examples of techniques for fabricating microcomponents are disclosed in U.S. Pat. No. 4,740,410 issued to Muller et al. entitled "MICROMECHANICAL ELEMENTS AND METHODS FOR THEIR FABRICATION," U.S. Pat. No. 5,660,680 issued to Chris Keller entitled "METHOD FOR FABRICATION OF HIGH VERTICAL ASPECT RATIO THIN FILM STRUCTURES," and U.S. Pat. No. 5,645,684 issued to Chris Keller entitled "MULTILAYER HIGH VERTICAL ASPECT RATIO THIN FILM STRUCTURES."

Such fabrication techniques generally have a "minimum feature size," which specifies the minimum amount of spacing that can be defined between separate components during fabrication. For instance, such minimum feature size may specify a minimum width of the smallest line (or gap) that may be included in a design when utilizing lithography (e.g., optical lithography or x-ray lithography). While fabrication techniques have evolved to generally reduce the required minimum feature size in accordance with Moore's law, and it is generally expected that the minimum feature size will continue to be reduced in the future in accordance with Moore's law. It is often desirable to further reduce the spacing between components beyond that available during the fabrication process (e.g., beyond the required minimum feature size of a fabrication process). For example, techniques for fabricating microcomponents are available that require a minimum feature size of approximately one micron (a micron, abbreviated μm, is one-millionth of a meter or $10^{-6}$ m). Accordingly, utilizing such fabrication process, microcomponents are generally separated from each other by at least approximately 1 μm. It is often desirable to reduce such separation distance after the microcomponents are fabricated.

Turning to FIG. 1A, an example of microcomponents being fabricated on a substrate (e.g., a wafer) 100 according to a fabrication process requiring a minimum feature size is shown. For instance, microcomponents 102 and 103 are fabricated, which are required to be separated by a distance equal to or greater than the minimum feature size (MFS) required by the particular fabrication process utilized. For instance, fabrication techniques are available in which such MFS is approximately 1 μm, in which case microcomponents 102 and 103 must be fabricated with a separation distance of at least 1 μm. Of course, it may be desirable to reduce such separation distance between microcomponents 102 and 103. For example, microcomponents 102 and 103 may be gears having teeth that are intended to interlock. For instance, it may be desirable for the teeth of microcomponent 102 to interlock with teeth of microcomponent 103, in the manner shown in FIG. 1B, so that motion from one microcomponent may be transferred to the other. Of course, such microcomponents 102 and 103, as fabricated, with a separation of at least the minimum feature size of the particular fabrication process utilized, does not result in the desired interlocking of the microcomponents' teeth. Therefore, a desire often exists for a post-fabrication method for reducing such spacing between microcomponents.

SUMMARY OF THE INVENTION

In view of the above, a desire exists for a post-fabrication method for reducing the spacing between microcomponents that results from the MFS required by the fabrication process utilized in fabricating the microcomponents. As more advanced components begin being developed on the microscale, it is anticipated that the desire for providing a post-fabrication technique for reducing undesirable spacing within and/or between microcomponents required by the fabrication technique utilized will further increase. A relatively simple example of gears being fabricated that are desired to have interlocking teeth is shown and described briefly above in conjunction with FIGS. 1A and 1B. Many other types of microcomponents may be developed, which are desired to be arranged with less spacing than permitted by the fabrication process utilized. For instance, component parts for constructing a micron-scale bearing may be fabricated. However, the particular fabrication process utilized for fabricating such component parts may result in too much "slop" in the resulting bearing, as a result of the minimum feature size required by the fabrication process. That is, too much spacing may be present between the component parts to enable the resulting microcomponent to suitably function as a bearing.

Many other microcomponents can be envisioned for which post-fabrication reduction of the minimum feature size required by the fabrication process utilized would be desirable. For instance, many microcomponents can be envisioned which it may be desirable to have separate parts engaging each other. For example, various devices may be assembled which includes at least one part that engages at least one other part to impart motion/movement to such other part. Just as many devices exist in the "macro world" having separate components that engage each other (e.g., gears, bearings, motors, etcetera), similar devices are/will be developed on the micro scale. In large-scale devices of the macro world, individual component parts can be machined down to have tolerances of approximately 2.5 µm, as an example. However, as discussed above, fabrication techniques for microcomponents often require tolerances of approximately 1 to 2 µm. Given that the entire microcomponent part may only be 100 µm (or less), for example, the relative "slop" resulting in the part is typically much greater on the micro scale than is present in macro devices.

Furthermore, once fabricated, microcomponents are relatively difficult to handle and/or assemble. That is, due to their small size, pick and place operations for microcomponents are very complex. For microassembly, the relative importance of the forces that operate is very different from that in the macro world. For example, gravity is usually negligible, while surface adhesion and electrostatic forces dominate. (See e.g. *A survey of sticking effects for micro parts handling*, by R. S. Fearing, IEEE/RSJ Int. Workshop on Intelligent Robots and Systems, 1995; *Hexsil tweezers for teleoperated microassembly*, by C. G. Keller and R. T. Howe, IEEE Micro Electro Mechanical Systems Workshop, 1997, pp. 72–77; and *Microassembly Technologies for MEMS*, by Micheal B. Cohn, Karl F. Böhringer, J. Mark Noworolski, Angad Singh, Chris G. Keller, Ken Y. Goldberg, and Roger T. Howe). Due to scaling effects, forces that are insignificant at the macro scale become dominant at the micro scale (and vice versa). For example, when parts to be handled are less than one millimeter in size, adhesive forces between a gripper (e.g., tweezers) and an object can be significant compared to gravitational forces. These adhesive forces arise primarily from surface tension, van der Waals, and electrostatic attractions and can be a fundamental limitation to handling of microcomponents.

Often, in attempting to place a microcomponent in a desired location, the component will "stick" or adhere to the placing mechanism due to the aforementioned surface adhesion forces present in microassembly, making it very difficult to place the component in a desired location. (See e.g., *Microfabricated High Aspect Ratio Silicon Flexures*, Chris Keller, 1998). For example, small-scale "tweezers" (or other types of "grippers") are used to perform such pick and place operations of microassembly, and often a component will adhere to the tweezers rather than the desired location, making placing the component very difficult. Accordingly, difficulty is present in attempting to handle microcomponents in an effort to accurately arrange them in a manner that reduces spacing resulting from the fabrication process utilized.

In view of the above, a desire exists in the prior art for a method and system that enable post-fabrication reduction/elimination of the minimum feature size spacing between microcomponents. Furthermore, a desire exists in the prior art for such a method and system that enable such reduction/elimination to be accomplished accurately and relatively easily. That is, given the above-described complexity involved in handling microcomponents, a desire exists for such a method and system that enable reduction/elimination of spacing resulting from the fabrication process utilizing post-fabrication assembly techniques that are relatively easy to accomplish. Furthermore, a desire exists in the prior art for a method and system that enable post-fabrication reduction/elimination of spacing between microcomponents in a manner that allows for great accuracy in the resulting assembly.

The present invention is directed to a system and method which enable post-fabrication reduction of minimum feature size spacing of microcomponents. More specifically, a method and system are disclosed for post-fabrication reduction/elimination of spacing between microcomponents, such spacing being required during fabrication of microcomponents due, for example, to the minimum feature size required by the particular fabrication process utilized. According to at least one embodiment, a method for producing an assembly of microcomponents is provided, in which at least two microcomponents are fabricated having a separation space therebetween. Such separation space may, for example, be a result of the minimum feature size allowed by the fabrication process utilized. At least one of the microcomponents includes an extension part that is operable to reduce the separation space. More specifically, according to at least one embodiment, such an extension part includes an extension member that is movably extendable away from its associated microcomponent to reduce the separation space between its associated microcomponent and another microcomponent.

The extension part may be implemented such that the extension member eliminates the separation space, thereby resulting in such extension member engaging another microcomponent. Once engaged, the extension member may be capable of imparting movement to the other microcomponent. For instance, an actuator may be coupled to the extension member that may be operable to cause such extension member to move, and the extension member may transfer such movement to the microcomponent which it engages. Additionally, at least one embodiment enables the extension member to be movably extended to engage another microcomponent without requiring power to be applied to the microcomponents for such engagement to be achieved. In this manner, power-off engagement of microcomponents may be recognized.

In various embodiments, the extension part further includes a latching mechanism operable to latch the movably extendable extension member in a desired position. For instance, in one embodiment one or more notches are included on the movably extendable extension member. Additionally, one or more engaging members that are positionally fixed relative to the extension member are included to engage the one or more notches, thereby latching the extension member in a desired position. The positionally fixed members may be arms having barbed ends arranged to engage the notches, in certain embodiments.

According to at least one embodiment of the present invention, a micro-assembly is provided that is insensitive to etching inaccuracy encountered in the fabrication process utilized to fabricate microcomponents of such micro-assembly. That is, if the mask layout for the microcomponents is over-etched or under-etched during the fabrication process, certain embodiments of the present invention enable desired positional relation between such microcomponents to still be achieved. For instance, in at least one embodiment, the extension part comprises features arranged such that the extension part compensates for etching inaccuracy. The extension part may be implemented in such a way that the extension member is movably extendable to reduce the separation space between it and another microcomponent to provide a resulting separation distance consistent with separation distance that would be recognized if the etching inaccuracy were not present (i.e., consistent with the mask layout).

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIGS. 2A and 2B show an exemplary implementation of a preferred embodiment of the present invention;

FIGS. 3A and 3B show an exemplary implementation of an alternative embodiment of the present invention;

FIGS. 4A and 4B show an exemplary application of a preferred embodiment of the present invention implementing a rotational gear assembly;

FIGS. 4A and 5B show an exemplary application of a preferred embodiment of the present invention implementing a linear stepper assembly;

FIGS. 6A and 6B show an exemplary application of an embodiment of the present invention implementing a planetary bearing;

FIGS. 7A and 7B show an additional exemplary implementation of a planetary bearing;

FIGS. 8A–8C show an exemplary implementation of an alternative embodiment of an extension member that may be utilized in various applications to provide a variably extendable part; and FIG. 9 shows an exemplary implementation of one embodiment of the present invention, which is insensitive to etching inaccuracy encountered during fabrication.

DETAILED DESCRIPTION

Figure 1A:
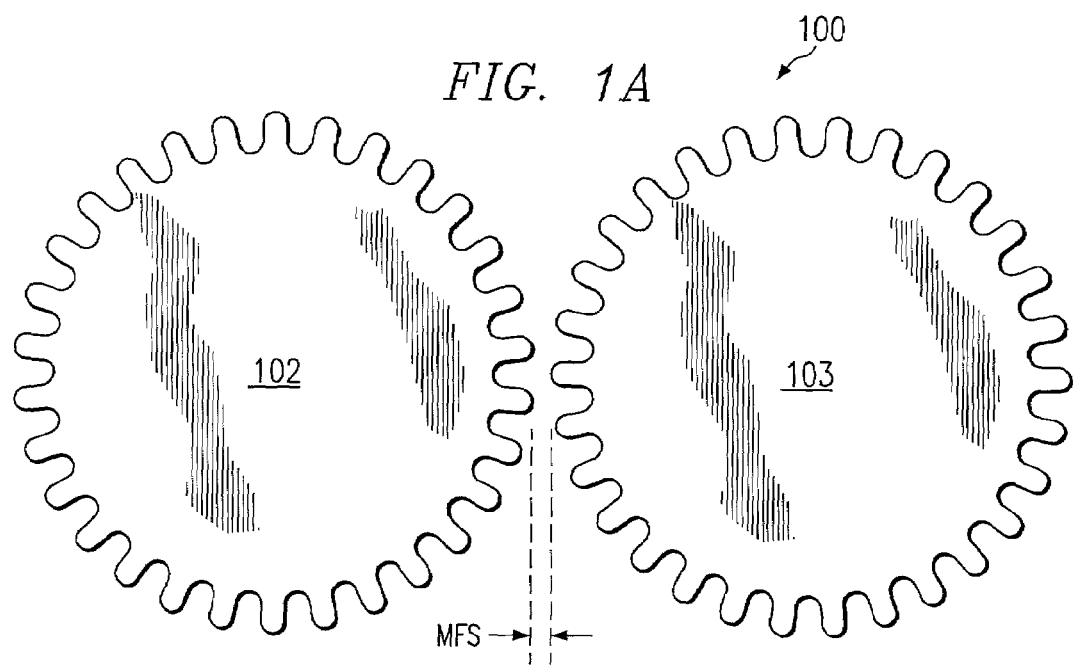
FIGS. 1A and 1B show an example of microcomponents fabricated according to a fabrication process requiring a minimum feature size, wherein it is desirable to have such minimum feature size reduced post-fabrication.
Figure 1B:
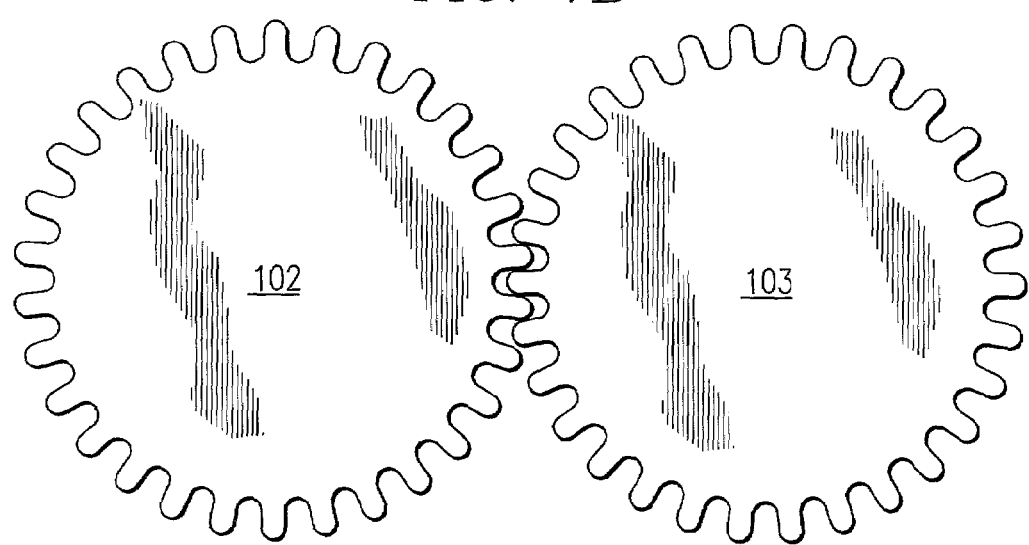

Turning to FIG. 2A, an exemplary implementation of a preferred embodiment of the present invention is shown. As shown, two microcomponents ("microcomponent A" and "microcomponent B") are fabricated on substrate (e.g., wafer) 200. As a result of the fabrication process utilized, the resulting microcomponents are separated from each other at least by the minimum feature size ("MFS") requirement of such fabrication process. As further shown, microcomponent A includes extension part 202, which enables post-fabrication reduction/elimination of the MFS separation between microcomponent A and microcomponent B. In this exemplary implementation, extension part 202 includes extension member (which may also be referred to herein as a "moveable member," "translation mechanism," or "sliding member") 204. Extension member 204 includes notches 206 and 208, as well as aperture (or "handle") 210. In this exemplary implementation extension part 202 further comprises arms 212 and 214 each having barbed ends (or "protruding members") 216 and 218, respectively. As shown in FIG. 2A, arms 212 and 214 each act as springs. Thus, extension part 202 includes a latching mechanism for latching extension member 204, wherein in this exemplary implementation such latching mechanism comprises notches 206 and 208 of extension member 204 and arms 212, 214 having barbed ends 216, 218.

As shown in FIG. 2A, the springs that form arms 212 and 214 are relaxed. That is, arms 212 and 214 are fabricated such that the springs formed thereby are relaxed (rather than compressed). Furthermore, in this exemplary implementation, extension member 204 is not coupled to arms 212, 214, but is instead a separate member capable of being moved relative to such arms 212, 214 (until latched). In operation, a user (or mechanical device, such as a robot) may apply sufficient force against extension member 204 in the direction toward microcomponent B, thereby causing extension member 204 to move toward microcomponent B. Preferably, a user may utilize a gripper device (e.g., tweezers or a probe) to engage handle 210, and then such gripper device may be utilized to apply the necessary force against extension member 204 in the direction toward microcomponent B. For instance, handle 210 may be an aperture in which a complementary gripper device may be utilized to engage such handle 210 in order to move extension member 204. Examples of such complementary handles/grippers that may be utilized are further disclosed in co-pending U.S. patent application Ser. No. 09/569,329 entitled "GRIPPER AND COMPLEMENTARY HANDLE FOR USE WITH MICRO-COMPONENTS" filed May 11, 2000, the disclosure of which has been incorporated herein by reference.

As extension member 204 is moved toward microcomponent B, it engages barbed ends 216 and 218, causing spring arms 212 and 214 to compress (or bend away from extension member 204). More specifically, in this exemplary embodiment, the width of extension member 204 gradually increases from its end nearest microcomponent B to its end farthest from microcomponent B. Thus, as it is moved toward microcomponent B, it engages barbed ends 216 and 218 and its width causes spring arms 212 and 214 to compress as it continues to move toward microcomponent B (until latched). As a result of moving extension member 204 toward microcomponent B, the MFS spacing between such components may be reduced. For instance, extension member 204 may be moved to a position such that it engages (contacts) microcomponent B.

Once extension member 204 is extended to a desired position, it may be latched in a manner that sufficiently secures such extension member 204 at the desired position. For instance, in the exemplary implementation of FIG. 2A, as extension member 204 is extended toward microcomponent B, notches 206 and 208 become aligned with barbed ends 216 and 218, at which point spring arms 212 and 214 relax toward their biased positions causing barbed ends 216 and 218 to engage notches 206 and 208, respectively, thereby latching extension member 204 into place.

According to at least one embodiment of the present invention, microcomponents A and B may be fabricated utilizing a fabrication process that enables one or more of such microcomponents to be released from substrate 200. For instance, in one embodiment, microcomponent A may be fixed to substrate 200, while microcomponent B may be released from such substrate 200. Once released, microcomponent B may be held in place to +/− the MFS. That is, some "slop" may be present in holding microcomponent B in place because of the MFS required by the fabrication process utilized. Various embodiments of the present invention provide mechanisms for reducing/eliminating such MFS spacing, which may enable more precise positioning of microcomponent B to be achieved. For example, as described further below, extension part 202 may allow reduction/elimination of the MFS between microcomponent A and microcomponent B, which may allow for greater precision in the positioning of microcomponent B relative to microcomponent A.

As a further example of utilizing one embodiment of the present invention to provide great precision in relative positioning of microcomponents, suppose microcomponents A and B are fabricated on substrate 200 (as shown in FIG. 2A). Further suppose that the fabrication process allows for microcomponent B, as well as extension member 204, to be released from substrate 200. For instance, a fabrication process as described more fully in co-pending U.S. patent application Ser. No. 09/616,500 entitled "SYSTEM AND METHOD FOR CONSTRAINING TOTALLY RELEASED MICROCOMPONENTS" filed Jul. 14, 2000, the disclosure of which has been incorporated herein by reference. Of course, any other suitable fabrication process may be utilized and be within the scope of the present invention. As an example, sacrificial release layers may be included, which may be released by exposing such sacrificial release layers to a releasing agent, such as hydrofluoric acid (HF), thereby releasing microcomponent B and extension member 204 from substrate 200. For instance, substrate 200 may be placed in an HF bath to sacrifice the release layers, thereby releasing such components from substrate 200. Once released, the components may become mis-positioned (e.g., they might float around in the HF bath) if not otherwise constrained. Constraining mechanisms, such as those disclosed in co-pending U.S. patent application Ser. No. 09/616,500 entitled "SYSTEM AND METHOD FOR CONSTRAINING TOTALLY RELEASED MICROCOMPONENTS," may be utilized to constrain released components (e.g., extension member 204 and microcomponent B of FIG. 2) to substrate 200. Additionally, extension member 204 may be positioned (as described more fully below) to reduce/eliminate the MFS spacing between the components, thereby enabling great precision to be maintained in the relative positioning of the components. As further described below, various other applications beyond achieving great precision in positioning components may be recognized through use of various embodiments of the present invention.

FIG. 2B further shows the exemplary implementation of FIG. 2A with extension member 204 fully extended and latched into place. More specifically, extension member 204 is extended to reduce/eliminate the spacing between it and microcomponent B. Extension member 204 is securely latched into place by barbed ends 216 and 218 having engaged notches 206 and 208, respectively. As FIG. 2B illustrates, once it is extended and latched into place, extension member 204 may be implemented to reduce the MFS spacing between extension part 202 and microcomponent B. Of course, extension member 204 may be implemented to engage microcomponent B when extended (i.e., eliminate the spacing therebetween), and any such implementation is intended to be within the scope of the present invention.

Thus, a preferred embodiment provides a post-fabrication method for relatively easily reducing/eliminating undesired spacing between and/or within microcomponents that are required by the fabrication process utilized to fabricate such microcomponents. For instance, in a most preferred embodiment, such post-fabrication assembly may be performed without being required to pick components up off of the substrate (e.g., wafer). For example, as described above with FIGS. 2A and 2B, a relatively simple post-fabrication step of moving extension member 204 toward microcomponent B to reduce/eliminate the spacing therebetween is utilized in a preferred embodiment. Furthermore, no parts are required to be picked up off of substrate 200 in order to reduce/eliminate the MFS spacing. By utilizing such a relatively simple post-fabrication process, the accuracy in microcomponent design can be improved beyond what can be accomplished through mere fabrication. That is, the required MFS of the particular fabrication process utilized limits the arrangement of microcomponents (in that they must be separated by the required MFS); however, a preferred embodiment of the present invention enables use of relatively simple post-fabrication assembly step(s) to arrange such microcomponents in a desired manner that is not so limited by the MFS of the fabrication process utilized.

Figure 3A:
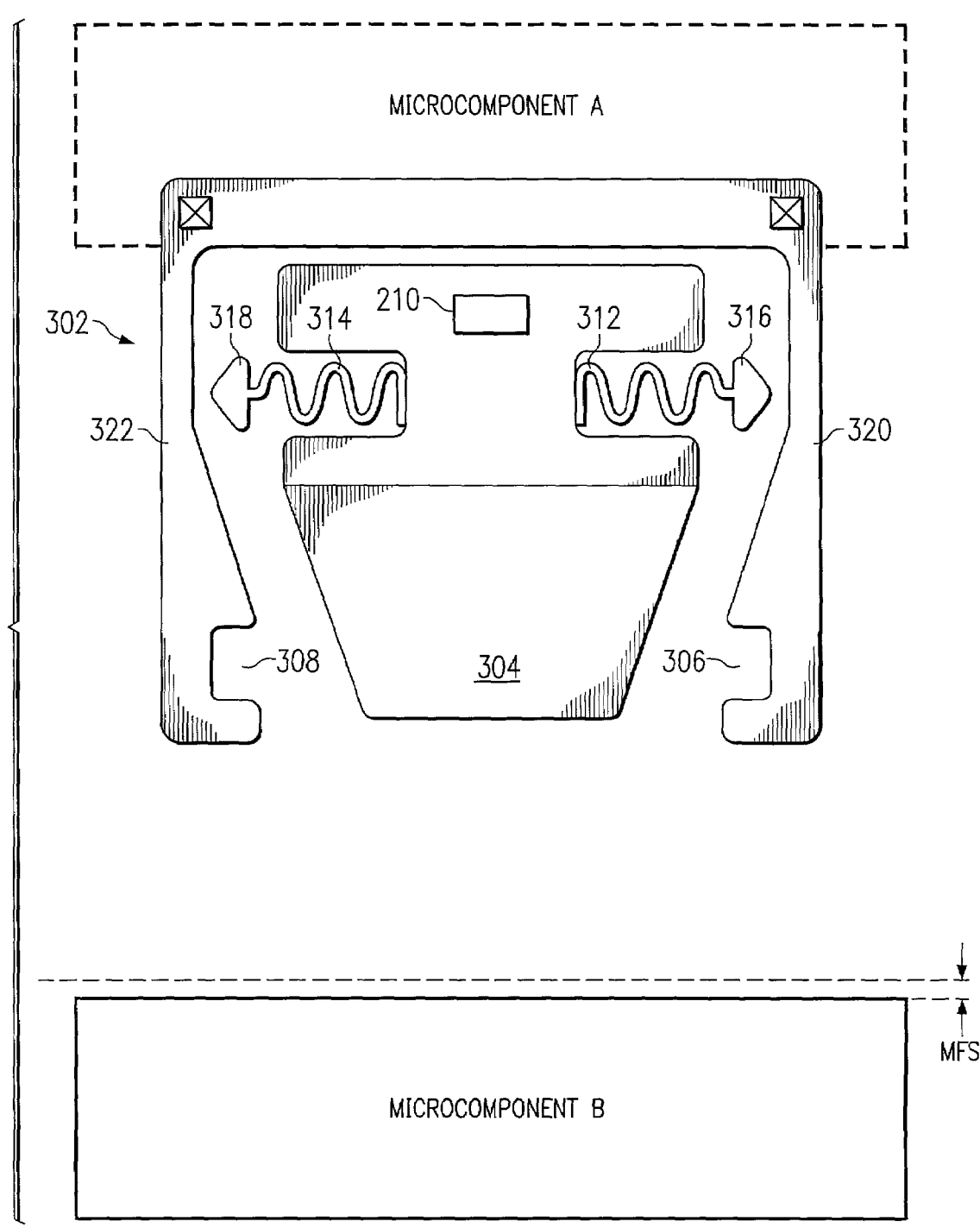

It should be understood that different types of latching mechanisms may be utilized for securing an extension member into place in various embodiments of the present invention. As described above with the exemplary implementation of FIGS. 2A and 2B, extension member 204 may include notches 206 and 208 that are engaged by barbed ends 216 and 218 of spring arms 212 and 214 to latch extension member 204 into place. An exemplary implementation of an alternative embodiment that utilizes a different implementation for latching the extension member is shown in FIGS. 3A and 3B, wherein like reference numerals are utilized to identify like parts as those of FIGS. 2A and 2B. As shown, two microcomponents ("microcomponent A" and "microcomponent B") are fabricated on substrate (e.g., wafer) 300. As a result of the fabrication process utilized, the resulting microcomponents are separated from each other at least by the MFS requirement of such fabrication process. As further shown, microcomponent A includes extension part 302, 1:5 which enables post-fabrication reduction/elimination of the MFS separation between microcomponent A and microcomponent B. As with the implementation of FIGS. 2A and 2B, extension part 302 includes an extension member 304. In this exemplary implementation, extension member 304 includes aperture (or "handle") 210. Extension member 304 further includes engaging members 316 and 318, which are springably coupled to extension member 304 by springs 312 and 314, respectively. As shown in FIG. 3A, springs 312 and 314 are relaxed, as fabricated. In this exemplary embodiment, adjacent walls 320 and 322 are arranged on opposing sides of extension member 304, and such walls 320, 322 include notches 306 and 308, respectively.

Extension member 304 is not coupled to adjacent walls 320 and 322, but is instead a separate member capable of being moved relative to such walls 320, 322 (until latched). In operation, a user (or mechanical device, such as a robot) may apply sufficient force against extension member 304 in the direction toward microcomponent B, thereby causing extension member 304 to move toward microcomponent B. As described above with the exemplary implementation of FIGS. 2A and 2B, a user may utilize a gripper device (e.g., tweezers or a probe) to engage handle 210, and then such gripper device may be utilized to apply the necessary force against extension member 304 in the direction toward microcomponent B. As extension member 304 is moved toward microcomponent B, engaging members 316 and 318 engage adjacent walls 320 and 322, respectively, causing springs 312 and 314 to compress. More specifically, in this exemplary embodiment, the width between adjacent walls 320 and 322 gradually decreases from the end farthest from microcomponent B to the end nearest microcomponent B. Thus, as extension member 304 is moved toward microcomponent B, engaging members 316 and 318 engage adjacent walls 320 and 322, and the decreasing width between such adjacent walls 320 and 322 causes springs 312 and 314 to compress as extension member 304 continues to move toward microcomponent B (until latched). As a result of moving extension member 304 toward microcomponent B, the MFS spacing between such components may be reduced. For instance, extension member 304 may be moved to a position such that it engages (contacts) microcomponent B. As a result of moving extension member 304 toward microcomponent B, the MFS spacing between such components may be reduced. For instance, extension member 304 may be moved to a position such that it engages (contacts) microcomponent B.

Once extension member 304 is extended to a desired position, it may be latched in a manner that sufficiently secures such extension member 304 at the desired position. For instance, in the exemplary implementation of FIG. 3A, as extension member 304 is extended toward microcomponent B, engaging members 316 and 318 become aligned with notches 306 and 308 of adjacent walls 320 and 322, at which point springs 312 and 314 relax toward their biased positions causing engaging members 316 and 318 to engage notches 306 and 308, respectively, thereby latching extension member 304 into place. Thus, the latching mechanism of this exemplary embodiment may include notches 306 and 308 arranged on adjacent walls 320 and 322, as well as engaging members 316 and 318 springably coupled to extension member 304.

FIG. 3B further shows the exemplary implementation of FIG. 3A with extension member 304 fully extended and latched into place. More specifically, extension member 304 is extended to reduce/eliminate the spacing between it and microcomponent B. Extension member 304 is securely latched into place by engaging members 316 and 318 having engaged notches 306 and 308, respectively. Once it is extended and latched into place, extension member 304 may be implemented to engage microcomponent B (i.e., eliminate the spacing therebetween). Of course, extension member 304 may instead be implemented to only reduce the MFS spacing between it and microcomponent B (as shown in FIG. 3B), rather than fully eliminating such spacing.

Figure 4A:
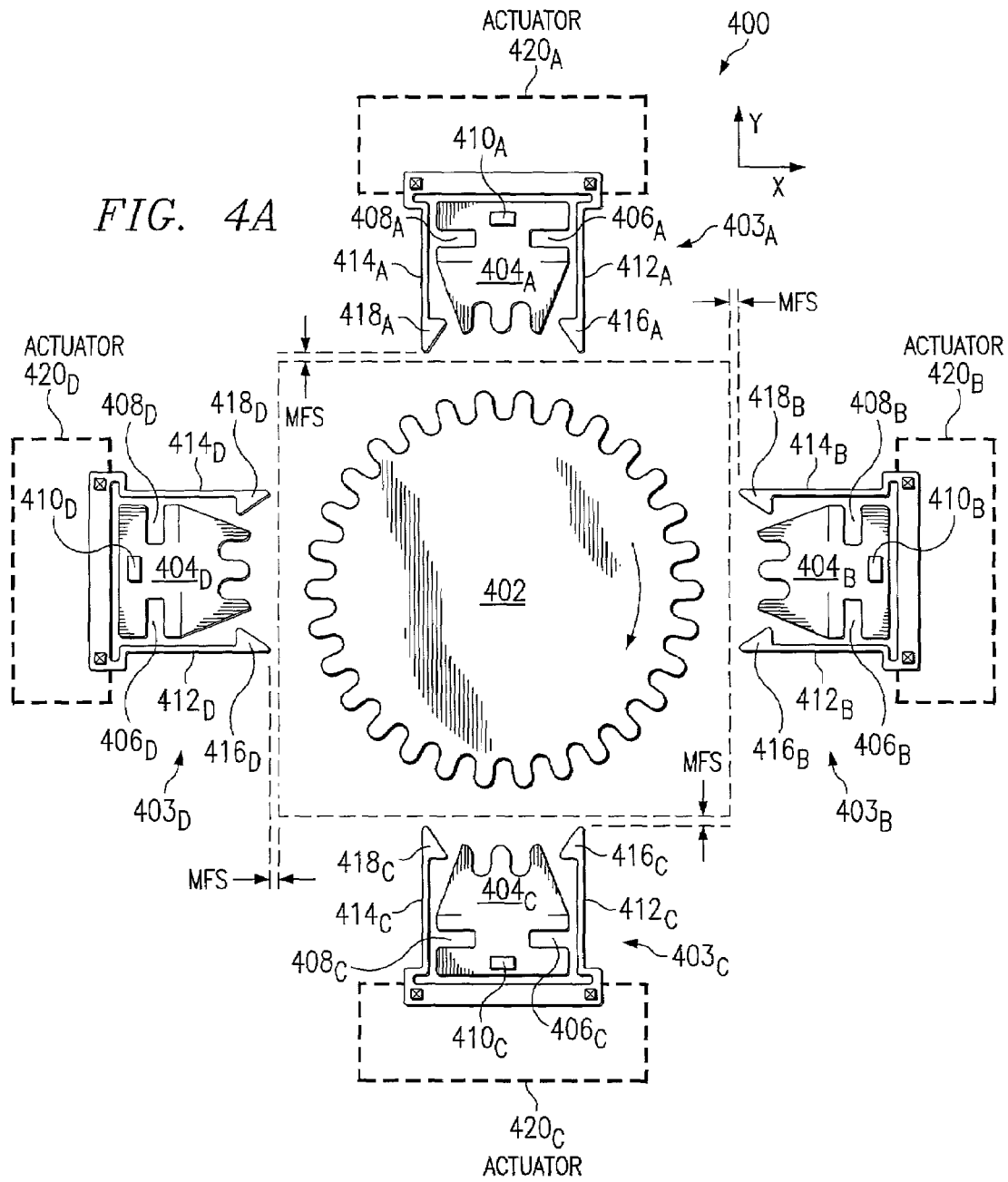

Turning now to FIGS. 4A and 4B, an exemplary application of a preferred embodiment of the present invention is shown for implementing a rotational gear assembly. Substrate (e.g., wafer) 400 includes rotational gear 402, which has a toothed-edge and is capable of rotating. Substrate 400 further includes four extension parts $403_A$, $403_B$, $403_C$, and $403_D$ (referred to collectively as extension parts 403), which are coupled to actuators $420_A$, $420_B$, $420_C$, and $420_D$ (referred to collectively as actuators 420), respectively. As fabricated, each of extension parts 403 are spaced from rotational gear 402 by at least the required MFS of the fabrication process utilized. In this exemplary application, extension parts 403 are implemented such that post-fabrication assembly may be performed to allow such extension parts to engage rotational gear 402. Once engaged, an extension part's actuator may cause such extension part to move, thereby transferring such movement to rotational gear 402. For instance, as shown in FIGS. 4A and 4B, each actuator may be capable of movement along an X and Y axis. That is, each actuator is capable of moving its respective extension part toward and away from rotational gear 402, and each actuator is capable of moving its respective extension part along a tangential plane with respect to rotational gear 402 in order to impart rotational motion to rotational gear 402.

In this exemplary implementation, each extension part 403 includes an extension member, i.e., extension members $404_A$, $404_B$, $404_C$, and $404_D$ (referred to collectively as extension members 404). Each extension part 403 is implemented with the exemplary latching mechanism described above in conjunction with FIGS. 2A and 2B. Thus, extension member $404_A$ includes notches $406_A$ and $408_A$; extension member $404_B$ includes notches $406_B$ and $408_B$; extension member $404_C$ includes notches $406_C$ and $408_C$; and extension member $404_D$ includes notches $406_D$ and $408_D$. For convenience in describing FIGS. 4A and 4B, the notches of extension members 404 are referred to collectively as notches 406 and 408. Extension members 404 further include handles (e.g., apertures) $410_A$, $410_B$, $410_C$, and $410_D$ (referred to collectively as handles 410). Extension parts 403 further include arms $412_A$, $412_B$, $412_C$, $412_D$, $414_A$, $414_B$, $414_C$, and $414_D$ that act as springs (referred to collectively as spring arms 412 and 414). Spring arms 412 and 414 comprise barbed ends $416_A$, $416_B$, $416_C$, $416_D$, $418_A$, $418_B$, $418_C$, and $418_D$ (referred to collectively as barbed ends 416 and 418).

As shown in FIG. 4A, the springs formed by arms 412 and 414 are relaxed, as fabricated. Furthermore, in this exemplary implementation, extension members 404 are not coupled to such spring arms 412 and 414, but are instead separate members capable of being moved relative to such spring arms 412 and 414 (until latched). According to a preferred embodiment, a user may execute relatively simple post-fabrication assembly step(s) in order to engage the extension members 404 with rotational gear 402. More specifically, a user (or mechanical device, such as a robot) may apply sufficient force against the extension members 404 in the direction toward rotational gear 402, thereby causing such extension members 404 to move toward rotational gear 402. Preferably, a user may utilize a gripper device (e.g., tweezers or a probe) to engage each handle 410 and apply the necessary force against the handle's respective extension member 404 in the direction toward rotational gear 402. As a result of moving an extension member 404 toward rotational gear 402, the MFS spacing between such components may be reduced. For instance, each extension member 404 may be moved to a position such that it engages (contacts) rotational gear 402.

As each extension member 404 is extended toward rotational gear 402, it is latched in a manner that sufficiently secures such extension member. More specifically, as each extension member 404 is extended toward rotational gear 402, the extension member's notches 406 and 408 become aligned with barbed ends 416 and 418, at which point spring arms 412 and 414 relax toward their biased positions causing barbed ends 416 and 418 to engage notches 406 and 408, respectively, thereby latching the extension member 404 into place.

FIG. 4B further shows the exemplary implementation of FIG. 4A with each extension member 404 fully extended and latched into place. More specifically, each extension member 404 is extended to engage rotational gear 402, thereby having reduced/eliminated the spacing therebetween. Each extension member 404 is securely latched into place by their associated barbed ends 416 and 418 having engaged their respective notches 406 and 408. As FIG. 4B illustrates, all of extension parts 403 may be implemented to simultaneously engage rotational gear 402 once the post-fabrication assembly process is complete (e.g., once the extension members are extended and latched). Of course, the rotational gear assembly may instead be implemented such that only one or two of the extension parts 403 simultaneously engage rotational gear 402 once the post-fabrication assembly process is complete. It should be recognized that the exemplary application of a preferred embodiment as shown in FIGS. 4A and 4B achieves a micro-rotational-gear assembly that comprises rotational gear 402 and one or more extension parts 403 that are moveable by an associated actuator 420 to transfer motion to rotational gear 402. Such resulting micro-rotational-gear assembly may be utilized on substrate 400 or may be removed from substrate 400 and implemented as a component of a larger system. For instance, each extension part 403 may be approximately 100 µm in size, rotational gear 402 may be approximately 500 µm in size, and the resulting micro-rotational-gear assembly may be approximately 1000 µm in size. Of course, various embodiments of the present invention may be utilized in achieving a micro-rotational-gear assembly having any dimensions, and any such implementation is intended to be within the scope of the present invention.

One advantage that a preferred embodiment of the present invention provides is power-off engagement of microcomponents. For instance, in the exemplary application of FIGS. 4A and 4B, a rotational gear assembly is achieved, wherein one or more of the extension components 403 engage rotational gear 402 when no electrical power is applied to their respective actuators 420. As an example, the arrangement of FIG. 4B may be achieved with no power being applied to the actuators 420, and power may thereafter be applied to the actuators to cause movement of the associated extension part 403 (e.g., to move the associated extension part along the X or Y axis. Thus, once the post-fabrication assembly steps are taken to cause extension parts 403 to engage rotational gear 402, power may be applied to the actuators 420 to enable such extension parts 403 to be moved in a manner that transfers rotational motion to rotational gear 402 and/or in a manner to disengage rotational gear 402.

Such power-off engagement of microcomponents has not been available in the prior art. Because of the MFS spacing between microcomponents, as fabricated, power is typically required to be applied for engagement of microcomponents. That is, if microcomponents are implemented to engage each other at all in prior art solutions, they are typically disengaged on power-off and require power to engage. It is often desirable to provide engagement of microcomponents upon power-off. For instance, again referring to the exemplary rotational gear assembly described in FIGS. 4A and 4B, upon fabrication of rotational gear 402 it may be relatively free-spinning until engaged by an extension part 403. That is, as fabricated, there is a space (e.g., equal to or greater than the MFS of the fabrication process utilized) between the teeth of rotational gear 402 and the teeth of the extension members 404. Thus, without taking the post-fabrication assembly step(s) of a preferred embodiment to engage one or more of extension members 404 to rotational gear 402, rotational gear 402 would be free-spinning in the resulting rotational gear assembly when power is off to such assembly. Thus, when power is off, such rotational gear assembly could spin to an indeterminate position, especially if it is under load. Thus, it may be desirable to have the power-off engagement of the extension parts 403 with the rotational gear 402, as is possible with a preferred embodiment of the present invention, in order to secure rotational gear 402 to a known position when power is off to the rotational gear assembly.

A "back-bending" effect has been observed in actuators of the prior art, such as within polycrystalline silicon (poly-silicon) versions of a heat-drive actuator (or "heatuator"). One observation of such back-bending effect is provided by John H. Comtois, Victor M. Bright, and Mark W. Phipps of the Air Force Institute of Technology, Department of Electrical and Computer Engineering, in the article "Thermal microactuators for surface-micromachining processes," published in *SPIE*, vol. 2642. For instance, heating of an arm of an actuator (e.g., resulting from electrical current being applied thereto) can result in melting of the arm causing the back-bending effect. While such a back-bending effect may typically be viewed as an undesirable deformity of the actuator, it may result in reduction in the MFS spacing between components.

For example, the actuator may be arranged on a substrate separated from a microcomponent by a space equal to or greater than the MFS of the fabrication process utilized, and back-bending may result in the actuator deforming to reduce the spacing between it and the microcomponent. Furthermore, because such back-bending may result in the actuator being bent with no power applied to the actuator and the actuator may move in the direction opposite the direction toward which the actuator bends, such back-bending may allow for power-off engagement of microcomponents by such an actuator. For instance, an actuator may back-bend in a manner that results in the actuator engaging a microcomponent, and power may then be applied to the actuator to cause the back-bent actuator to disengage the microcomponent. However, back-bending of an actuator fails to provide a solution as desirable as provided by various embodiments of the present invention. For instance, it has been recognized that the amount of back-bending encountered in an actuator is generally difficult to control, and the amount of back-bending achieved is typically unpredictable. Accordingly, the amount of space reduction achieved between microcomponents through such back-bending technique may not be as specific or accurate as that of various embodiments of the present invention.

Figure 5B:
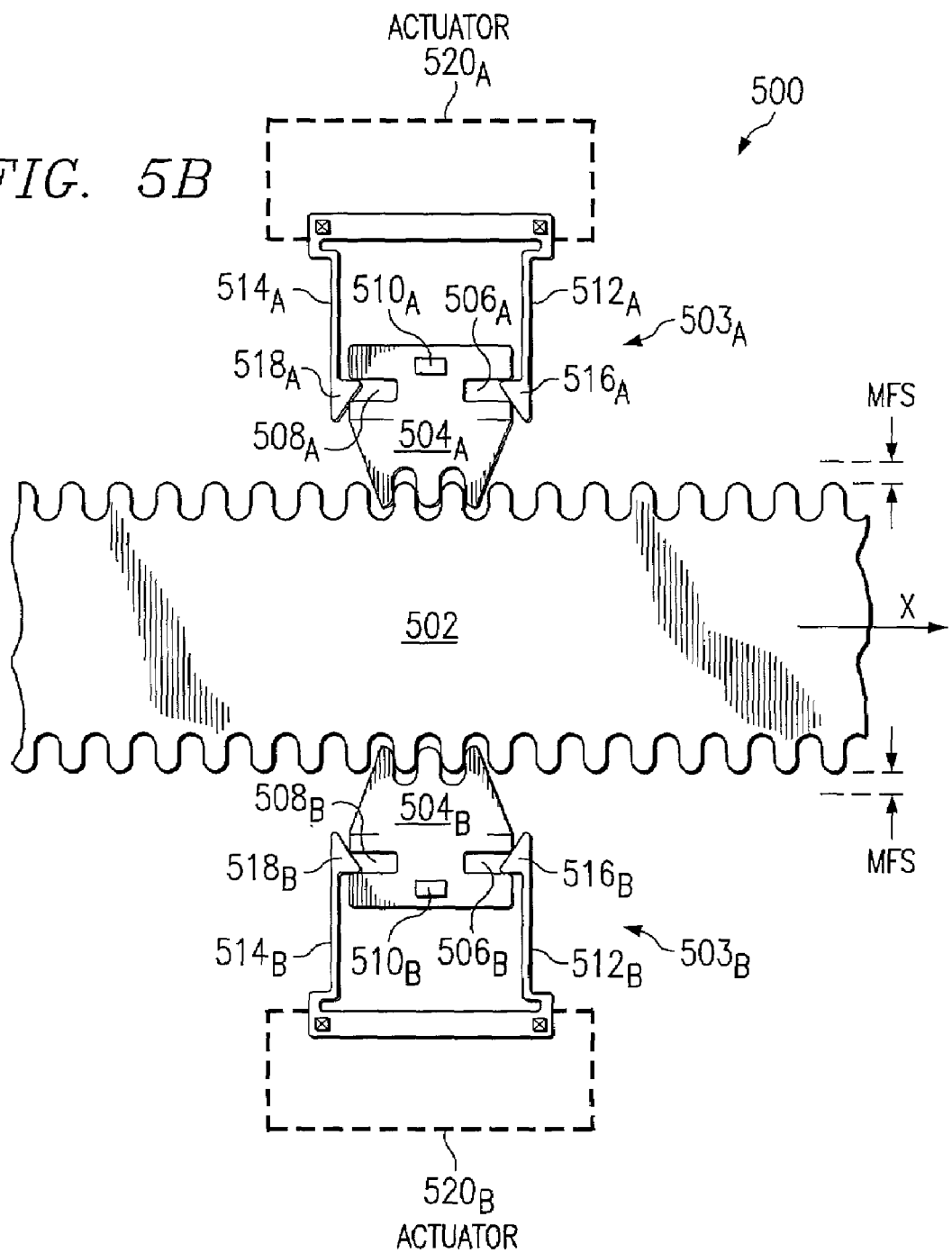

Turning now to FIGS. 5A and 5B, another exemplary application of a preferred embodiment of the present invention is shown, which implements a linear stepper assembly. Substrate (e.g., wafer) 500 includes linear stepper 502, which has opposing toothed-edges and is capable of advancing linearly along the X axis shown in FIGS. 5A and 5B. Substrate 500 further includes two extension parts $503_A$ and $503_B$ (referred to collectively as extension parts 503), which are coupled to actuators $520_A$ and $520_B$ (referred to collectively as actuators 520), respectively. As fabricated, each of extension parts 503 are spaced from linear stepper 502 by at least the required MFS of the fabrication process utilized. In this exemplary application, extension parts 503 are implemented such that post-fabrication assembly may be performed to allow such extension parts to engage linear stepper 502. Once engaged, an extension part's actuator may cause such extension part to move, thereby transferring such movement to linear stepper 502. For instance, as shown in FIGS. 5A and 5B, each actuator may be capable of movement along an X and Y axis. That is, each actuator is capable of moving its respective extension part toward and away from linear stepper 502, and each actuator is capable of moving its respective extension part along a tangential plane with respect to linear stepper 502 in order to impart translational motion to linear stepper 502.

In this exemplary implementation, each extension part 503 includes an extension member, i.e., extension members $504_A$ and $504_B$ (referred to collectively as extension members 504). Each extension part 503 is implemented with the exemplary latching mechanism described above in conjunction with FIGS. 2A and 2B. Thus, extension member $504_A$ includes notches $506_A$ and $508_A$, and extension member $504_B$ includes notches $506_B$ and $508_B$. For convenience in describing FIGS. 5A and 5B, the notches of extension members 504 are referred to collectively as notches 506 and 508. Extension members 504 further include handles (e.g., apertures) $510_A$ and $510_B$ (referred to collectively as handles 510). Extension parts 503 further include arms $512_A$, $512_B$, $514_A$, and $514_B$ that act as springs (referred to collectively as spring arms 512 and 514). Spring arms 512 and 514 comprise barbed ends $516_A$, $516_B$, $518_A$, and $518_B$ (referred to collectively as barbed ends 516 and 518).

As shown in FIG. 5A, the springs that form arms 512 and 514 are relaxed, as fabricated. Furthermore, in this exemplary implementation, extension members 504 are not coupled to such spring arms 512 and 514, but are instead separate members capable of being moved relative to such spring arms 512 and 514 (until latched). According to a preferred embodiment, a user may execute relatively simple post-fabrication assembly step(s) in order to engage the extension members 504 with linear stepper 502. More specifically, a user (or mechanical device, such as a robot) may apply sufficient force against the extension members 504 in the direction toward linear stepper 502, thereby causing such extension members 504 to move toward linear stepper 502. Preferably, a user may utilize a gripper device (e.g., tweezers or a probe) to engage each handle 510 and apply the necessary force against the handle's respective extension member 504 in the direction toward linear stepper 502. As a result of moving an extension member 504 toward linear stepper 502, the MFS spacing between such components may be reduced. For instance, each extension member 504 may be moved to a position such that it engages (contacts) linear stepper 502.

As each extension member 504 is extended toward linear stepper 502, it is latched in a manner that sufficiently secures such extension member. More specifically, as each extension member 504 is extended toward linear stepper 502, the extension member's notches 506 and 508 become aligned with barbed ends 516 and 518, at which point spring arms 512 and 514 relax toward their biased positions causing barbed ends 516 and 518 to engage notches 506 and 508, respectively, thereby latching the extension members 504 into place.

FIG. 5B further shows the exemplary implementation of FIG. 5A with each extension member 504 fully extended and latched into place. More specifically, each extension member 504 is extended to engage linear stepper 502, thereby having reduced/eliminated the spacing therebetween. Each extension member 504 is securely latched into place by their associated barbed ends 516 and 518 having engaged their respective notches 506 and 508. As FIG. 5B illustrates, both of extension parts 503 may be implemented to simultaneously engage linear stepper 502 once the post-fabrication assembly process is complete (e.g., once the extension members are extended and latched). Of course, the linear stepper assembly may instead be implemented such that only one of the extension parts 503 simultaneously engage linear stepper 502 once the post-fabrication assembly process is complete. It should be recognized that the exemplary application of a preferred embodiment as shown in FIGS. 5A and 5B achieves a micro-linear-stepper assembly that comprises linear stepper 502 and one or more extension parts 503 that are moveable by an associated actuator 520 to transfer linear motion to linear stepper 502. Such resulting micro-linear-stepper assembly may be utilized on substrate 500 or may be removed from substrate 500 and implemented as a component of a larger system. For instance, each extension part 503 may be approximately 100 μm in size, linear stepper 502 may be approximately 500 μm in size, and the resulting micro-linear-stepper assembly may be approximately 1000 μm in size. Of course, various embodiments of the present invention may be utilized in achieving a micro-linear-stepper assembly having any dimensions, and any such implementation is intended to be within the scope of the present invention.

As discussed above with the exemplary application of FIGS. 4A and 4B, one advantage that a preferred embodiment of the present invention provides is power-off engagement of microcomponents. For instance, in the exemplary application of FIGS. 5A and 5B, a linear stepper assembly is achieved, wherein one or more of the extension components 503 engage linear stepper 502 when no power is applied to their respective actuators 520. As an example, the arrangement of FIG. 5B may be achieved with no power being applied to the actuators 520, and power may thereafter be applied to the actuators to cause movement of the associated extension part 503 (e.g., to move the associated extension part along the X or Y axis). Thus, once the post-fabrication assembly steps are taken to cause extension parts 503 to engage linear stepper 502, power may be applied to the actuators 520 to enable such extension parts 503 to be moved in a manner that transfers translational motion to linear stepper 502 and/or in a manner to disengage linear stepper 502. Again, such power-off engagement of microcomponents has not been available in the prior art. Because of the MFS spacing between microcomponents, as fabricated, power is typically required to be applied for engagement of microcomponents. That is, if microcomponents are implemented to engage each other at all in prior art solutions, they are typically disengaged on power-off and require power to engage.

Figure 6A:
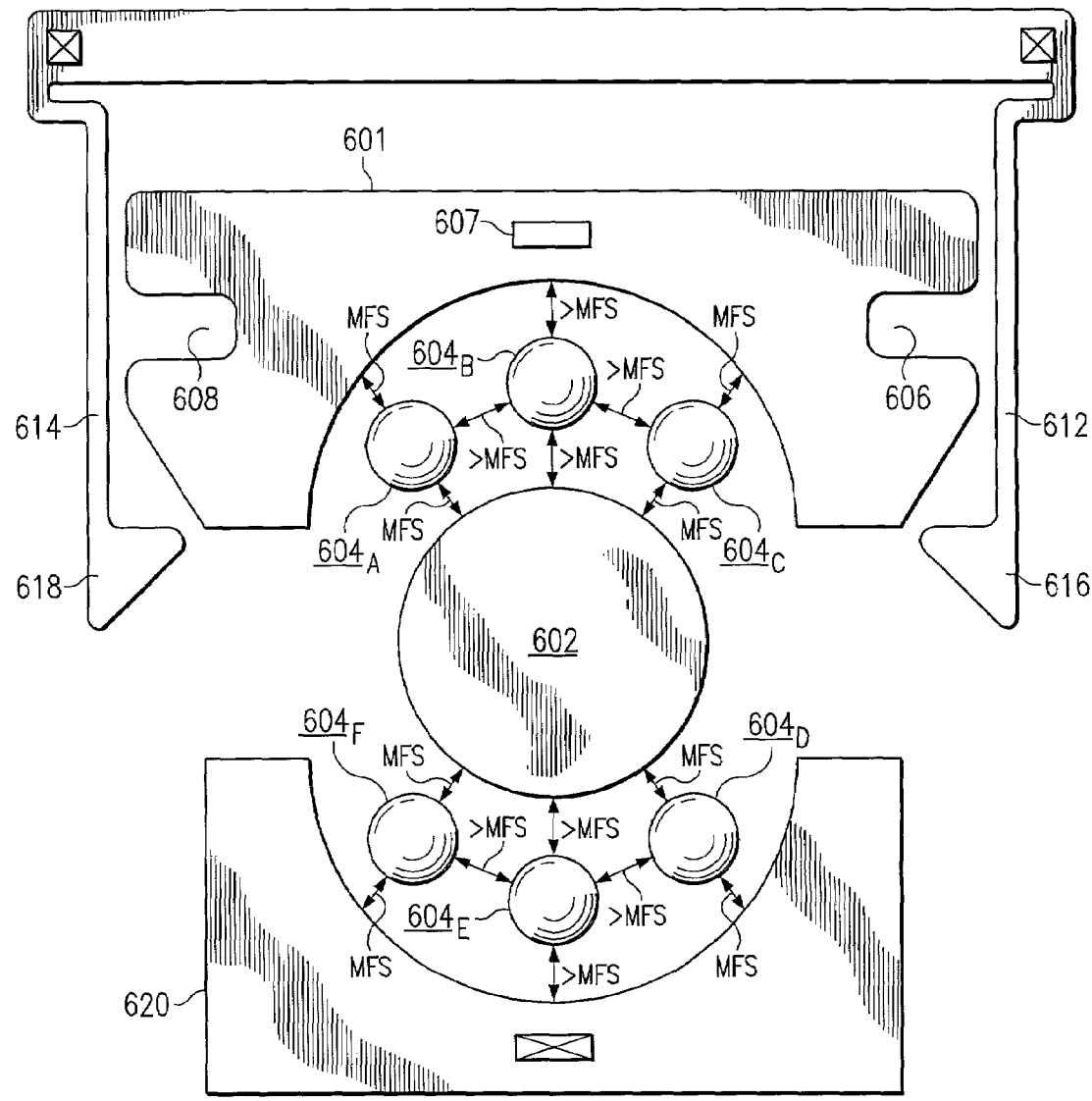

Turning now to FIGS. 6A and 6B, yet another exemplary application of a preferred embodiment of the present invention is shown, which implements a planetary bearing assembly. FIGS. 6A and 6B provide an example of a microcomponent assembly that includes various separate parts that are separated from each other by at least the MFS of the particular fabrication process utilized to fabricate such parts. The exemplary planetary bearing assembly shown includes first casing portion 601 and second casing portion 620 (which may also be referred to herein as first bearing wall portion and second bearing wall portion), ball bearings 604A–604F (referred to collectively as ball bearings 604), and shaft 602.

As further shown in FIGS. 6A and 6B, substrate (e.g., wafer) 600 includes an extension part made up of first casing portion 601, which forms an extension member (and may also be referred to herein as extension member 601), and a latching mechanism for latching extension member 601. In this example, the exemplary latching mechanism described above in conjunction with FIGS. 2A and 2B is implemented. Thus, extension member 601 includes notches 606 and 608. Extension member 601 may further include handle (e.g., aperture) 607. The extension part further includes arms 612 and 614 that act as springs. Spring arms 612 and 614 comprise barbed ends 616 and 618. As shown in FIG. 6A, the springs that form arms 612 and 614 are relaxed, as fabricated. Furthermore, in this exemplary implementation, extension member 601 is not coupled to such spring arms 612 and 614, but is instead a separate member capable of being moved relative to such spring arms 612 and 614 (until latched). As the example of FIGS. 6A and 6B illustrates, in certain embodiments, the extension member (e.g., extension member 601) may form a part of a microcomponent assembly to be constructed (e.g., a first casing portion of a planetary bearing assembly).

Various parts of the planetary bearing assembly of FIG. 6A may be released from substrate (e.g., wafer) 600. For instance, first casing portion 601 (or extension member 601), ball bearings 604, and shaft 602 may be released from substrate 600. Of course, constraining mechanisms, such as those disclosed in co-pending U.S. patent application Ser. No. 09/616,500 entitled "SYSTEM AND METHOD FOR CONSTRAINING TOTALLY RELEASED MICROCOMPONENTS" filed Jul. 14, 2000, may be utilized to constrain such released parts to substrate 600. In at least one embodiment, second casing portion 620 may be fixed to substrate 600.

As fabricated, each of the separate parts of the planetary bearing assembly are separated by a space equal to or greater than the MFS of the fabrication process utilized. A planetary ball bearing with that much separation (or "slop") may not function as desired. Thus, according to at least one embodiment of the present invention, post-fabrication assembly may be performed to reduce/eliminate the undesirable separation (or "slop") present in the planetary bearing assembly as fabricated. According to at least one embodiment, a user may execute relatively simple post-fabrication assembly step(s) in order to engage a first part of the planetary bearing assembly (e.g., first casing portion 601) to a second part of the planetary bearing assembly (e.g., to second casing portion 620) to form a desired micro-planetary-bearing-assembly having spacing less than the spacing required by the MFS of the fabrication process. More specifically, a user (or mechanical device, such as a robot) may apply sufficient force against first casing portion 601 (or extension member 601) in the direction toward second casing portion 620 to cause such first casing portion 601 to move toward second casing portion 620 to engage the two parts such that they form a desired micro-assembly having separate parts with distance between them of less than the required MFS of the fabrication process.

In the example of FIG. 6A, handle 607 is provided on first casing portion 601. Supposing that at least first casing portion 601, ball bearings 604 and shaft 602 are released from substrate 600, a user may engage handle 607 and apply sufficient force to move first casing portion 601 toward second casing portion 620. As first casing portion 601 moves toward second casing portion 620, the spacing between various parts of the planetary bearing assembly may be reduced below the MFS. For instance, first casing portion 601 may engage one or more of ball bearings 604 and impart movement thereto resulting in reduction in the MFS between such ball bearings 604 and other components of the assembly (e.g., shaft 602). As first casing portion (or extension member) 601 is extended toward second casing portion 620, it is latched in a manner that sufficiently secures such first casing portion. More specifically, as first casing portion 601 is extended toward second casing portion 620, notches 606 and 608 become aligned with barbed ends 616 and 618, at which point spring arms 612 and 614 relax toward their biased positions causing barbed ends 616 and 618 to engage notches 606 and 608, respectively, thereby latching first casing portion 601 into place. As further shown in FIG. 7B, once latched into place, first casing portion 601 may engage second casing portion 620 to form a desired planetary bearing assembly.

FIG. 6B further shows the exemplary implementation of FIG. 6A with first casing portion 601 engaging second casing portion 620, thereby resulting in a micro-assembly (e.g., a micro-planetary-bearing assembly) in which separate parts have less separation than the MFS of the fabrication process utilized to fabricate such parts. Because of the reduction in such "slop" of the planetary bearing assembly, the resulting planetary bearing assembly may function much better than would otherwise be possible. Once the planetary bearing is assembled in this manner, ball bearings 604 may roll therein as shaft 602 rotates to provide a roller bearing. The resulting micro-planetary-bearing assembly may be utilized on substrate 600 or may be removed from substrate 600 and implemented as a component of a larger system.

Figure 7B:
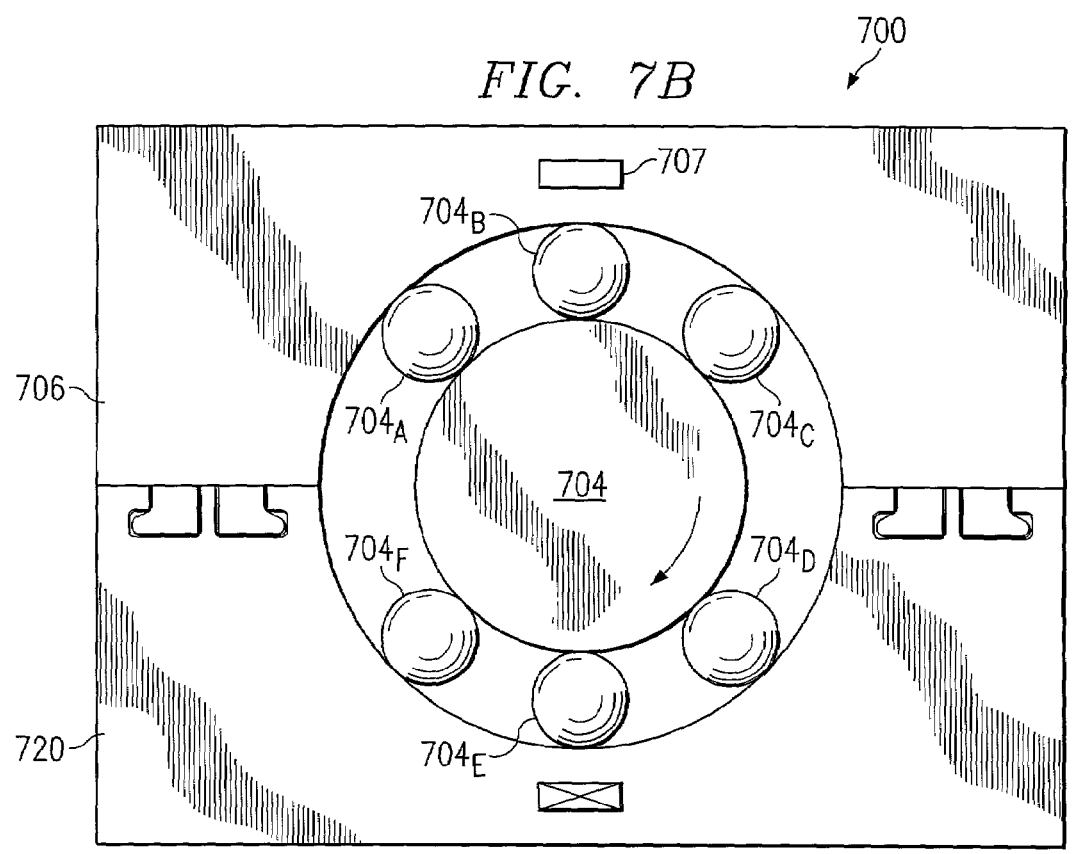

Turning now to FIGS. 7A and 7B, yet another exemplary planetary bearing assembly is shown. As shown in FIGS. 7A and 7B, it is recognized that microcomponents forming a planetary bearing assembly may be totally released from the substrate, and such microcomponents may be moved in a manner to form a desired assembly (a planetary bearing in this example). FIGS. 7A and 7B provide an example of a microcomponent assembly that includes various separate parts that are separated from each other by at least the MFS of the particular fabrication process utilized. The exemplary planetary bearing assembly shown includes first casing portion 706 and second casing portion 720 (which may also be referred to herein as first bearing wall portion and second bearing wall portion), ball bearings 704A–704F (referred to collectively as ball bearings 704), and shaft 702. As further shown, first casing portion 706 includes coupling mechanisms 708A and 708B (referred to collectively as coupling mechanisms 708) for coupling such first casing portion 706 with second casing portion 720. Such coupling mechanisms 708 (which may also be referred to herein as "latching mechanisms") implemented on casing portions 706 and/or 720 may be any suitable mechanism for coupling the microcomponent assembly portions, such as the mechanisms disclosed in co-pending U.S. patent application Ser. No. 09/570,170 entitled "SYSTEM AND METHOD FOR COU- PLING MICROCOMPONENTS" filed May 11, 2000, and co-pending U.S. patent application Ser. No. 09/643,011 entitled "SYSTEM AND METHOD FOR COUPLING MICROCOMPONENTS UTILIZING A PRESSURE FITTING RECEPTACLE" filed Aug. 21, 2000, the disclosures of which have been incorporated herein by reference. Further, although such coupling mechanisms are not included in the above exemplary implementation of a planetary bearing provided in FIGS. 6A–6B, it should be recognized that according to certain implementations, such coupling mechanisms may likewise be included in the implementation of FIGS. 6A–6B.

Various parts of the planetary bearing assembly of FIG. 7A may be released from substrate (e.g., wafer) 700. For instance, first casing portion 706, ball bearings 704, and shaft 702 may be released from substrate 700. Of course, constraining mechanisms, such as those disclosed in co-pending U.S. patent application Ser. No. 09/616,500 entitled "SYSTEM AND METHOD FOR CONSTRAINING TOTALLY RELEASED MICROCOMPONENTS" filed Jul. 14, 2000, may be utilized to constrain such released parts to substrate 700. In one embodiment, second casing portion 720 may be fixed to substrate 700. Although, in other embodiments, second casing portion 720 may be released from substrate 700 in addition to the other parts of the planetary bearing assembly being so released.

As shown in the example of FIG. 7A, coupling mechanism 708A may comprise arms 710 and 711 that act as springs, and such arms 710 and 711 have barbed ends 715 and 716, respectively. Similarly, coupling mechanism 708B may comprise arms 712 and 714 that act as springs, and such arms 712 and 714 have barbed ends 717 and 718, respectively. Thus, such coupling mechanisms 708 may comprise engaging members (e.g., arms 710, 711, 712, and 714), and second casing portion 720 may comprise complementary receptacles 721, 722, 723, and 724 that the engaging members may engage to couple first casing portion 706 to second casing portion 720, as described further hereafter.

In this example, a user may execute relatively simple post-fabrication assembly step(s) in order to couple a first part of the planetary bearing assembly (e.g., first casing portion 706) to a second part of the planetary bearing assembly (e.g., to second casing portion 720) to form a desired micro-planetary-bearing-assembly having spacing less than the spacing required by the MFS of the fabrication process. More specifically, a user (or mechanical device, such as a robot) may apply sufficient force against at least one released part of the planetary bearing assembly to cause such part to move toward another part of the planetary bearing assembly to engage the two parts such that they couple together, thereby forming a micro-assembly having separate parts with distance between them of less than the required MFS of the fabrication process.

In the example of FIG. 7A, handle 707 is provided on first casing portion 706. Supposing that at least first casing portion 706, ball bearings 704 and shaft 702 are released from substrate 700, a user may engage handle 707 and apply sufficient force to move first casing portion 706 toward second casing portion 720. As first casing portion 706 moves toward second casing portion 720, the spacing between various parts of the planetary bearing assembly may be reduced below the MFS. For instance, first casing portion 706 may engage one or more of ball bearings 704 and impart movement thereto resulting in reduction in the MFS between such ball bearings 704 and other components of the assembly (e.g., shaft 702). Coupling mechanisms 708 of first casing portion 706 engage the complementary receptacles of second casing portion 720 to couple (or latch) first casing portion 706 to second casing portion 720. FIG. 7B further shows the exemplary implementation of FIG. 7A with first casing portion 706 coupled to second casing portion 720 thereby resulting in a micro-assembly (e.g., a micro-planetary-bearing assembly) in which separate parts have less separation than the MFS of the fabrication process utilized to fabricate such parts.

A further embodiment of the present invention provides a variably extendable part, which enables flexibility in the post-fabrication assembly process as to the amount of reduction to be achieved in the separation spacing of different microcomponents. An exemplary implementation of such embodiment is shown in FIGS. 8A–8C. Turning first to FIG. 8A, "microcomponent A" may be fabricated on a substrate (not shown) along with other microcomponents (not shown). As a result of the fabrication process utilized, the resulting microcomponents are separated from each other at least by the minimum feature size ("MFS") requirement of such fabrication process. As further shown, microcomponent A includes variably extendable part 802, which enables post-fabrication reduction/elimination of the MFS separation between microcomponent A and another microcomponent (not shown). In this exemplary implementation, variably extendable part 802 is similar to the extension part described above in conjunction with FIGS. 2A–2B, but includes multiple notches positioned at different levels of the part to allow for variation in the amount of extension that may be achieved thereby.

Specifically, variably extendable part 802 includes extension member (which may also be referred to herein as a "moveable member," "translation mechanism," or "sliding member") 804. Extension member 804 includes a first level (or first set) of notches 806A and 806B (referred to collectively herein as first level notches 806), second level (or second set) of notches 807A and 807B (referred to collectively herein as second level notches 807), and third level (or third set) of notches 808A and 808B (referred to collectively herein as third level notches 808). While three levels of notches are shown in the example of FIGS. 8A–8C, it should be understood that any number of levels of notches may be so implemented to provide any desired amount of variability in the extension of extendable part 802. Extension member 804 further includes aperture (or "handle") 810. In this exemplary implementation variably extendable part 802 further comprises arms 812 and 814 each having barbed ends (or "protruding members") 816 and 818, respectively. Thus, variably extendable part 802 includes a latching mechanism for latching extension member 804, wherein in this exemplary implementation such latching mechanism comprises notches 806, 807, and 808 of extension member 804 and arms 812, 814 having barbed ends 816, 818. While a latching arrangement similar to that of FIGS. 2A–2B are shown for variably extendable part 802 of FIGS. 8A–8C, it should be understood that other suitable latching mechanisms, such as that of FIGS. 3A–3B may be implemented in a similar manner to allow variability in the amount of extension achieved thereby.

As shown in FIG. 8A, the spring arms 812 and 814 are relaxed, as fabricated. In operation, a user (or mechanical device, such as a robot) may apply sufficient force against extension member 804 in the direction extending away from microcomponent A, thereby causing extension member 804 to move away from microcomponent A. Preferably, a user may utilize a gripper device (e.g., tweezers or a probe) to engage handle 810, and then such gripper device may be utilized to apply the necessary force against extension member 804 in the direction away from microcomponent A. As extension member 804 is moved away from microcomponent A, it engages barbed ends 816 and 818, causing spring arms 812 and 814 to compress (or bend away from extension member 804). More specifically, in this exemplary embodiment, the width of extension member 804 gradually increases from the farthest from microcomponent A to the end nearest microcomponent A. Thus, as it is moved away from microcomponent A, it engages barbed ends 816 and 818 and its width causes spring arms 812 and 814 to compress as it continues to move away from microcomponent A (until latched). As a result of moving extension member 804 away from microcomponent A, the MFS spacing between extension member 804 and other microcomponents (not shown) may be reduced. For instance, extension member 804 may be moved to a position such that it engages (contacts) another microcomponent.

Once extension member 804 is extended to a desired position, it may be latched in a manner that sufficiently secures such extension member 804 at the desired position. For instance, in the exemplary implementation of FIG. 8A, as extension member 804 is extended away from microcomponent A, first level notches 806 become aligned with barbed ends 816 and 818, at which point spring arms 812 and 814 may relax toward their biased positions causing barbed ends 816 and 818 to engage first level notches 806, thereby latching extension member 804 into place to provide a first amount of extension. As extension member 804 is further extended away from microcomponent A, second level notches 807 become aligned with barbed ends 816 and 818, at which point spring arms 812 and 814 may relax toward their biased positions causing barbed ends 816 and 818 to engage second level notches 807, thereby latching extension member 804 into place to provide a second amount of extension. As extension member 804 is further extended away from microcomponent A, third level notches 808 become aligned with barbed ends 816 and 818, at which point spring arms 812 and 814 may relax toward their biased positions causing barbed ends 816 and 818 to engage third level notches 808, thereby latching extension member 804 into place to provide a third amount of extension.

FIG. 8B further shows the exemplary implementation of FIG. 8A with extension member 804 extended and latched into place at first level notches 806 to provide a first amount of extension. Similarly, FIG. 8C shows the exemplary implementation of FIG. 8A with extension member 804 extended and latched into place at second level notches 807 to provide a second amount of extension. Accordingly, variably extendable part 802 provides flexibility in that it enables variability in the amount of extension achieved thereby, which allows a user flexibility in the amount of spacing between microcomponents to be reduced.

Various embodiments of the present invention provide mechanisms that enable post-fabrication assembly to be performed to reduce the spacing between microcomponents resulting from the MFS required by the fabrication process utilized. Certain embodiments of the present invention provide such mechanisms (e.g., extension parts) for reducing the spacing between microcomponents, wherein the mechanisms are designed in a manner such that they compensate for inaccurate etching (e.g., over-etching or under-etching) that may occur during fabrication. In this manner, various embodiments of the present invention are etch insensitive, and hold their dimensions to mask tolerances, rather than fabrication tolerances. An example of such etch compensation feature is shown in FIG. 9 in conjunction with the exemplary extension part 202 of FIGS. 2A–2B. While the etch compensation feature is described hereafter in conjunction with the exemplary implementation of the extension part of FIGS. 2A–2B, it should be understood that various other implementations may be utilized which provide such etch compensation feature, and any such implementation is intended to be within the scope of the present invention.

Turning to FIG. 9, extension part 202 and microcomponent B are shown with the mask for each part being illustrated in dashed line and the actual parts resulting from fabrication being shown in solid line. As shown in this example, the mask for the parts was over-etched during fabrication, resulting in certain features of extension part 202 and microcomponent B having a different size than provided for in the mask layout. More specifically, certain features were over-etched by an amount shown as "ETCH" in FIG. 9. As those of ordinary skill in the art will appreciate, the amount over-etch or under-etch (shown as "ETCH" in FIG. 9) is typically consistent throughout a mask for parts that are arranged relatively close to each other. Various embodiments of the present invention are designed in a manner such that irrespective of the accuracy of the etching relative to the mask, extension part 202 results in reducing sufficient space between extension part 202 and microcomponent B such that they are positioned relative to each other in a consistent manner. That is, the design of extension part 202 allows for consistent positioning of extension member 204 relative to microcomponent B to be achieved, irrespective of the accuracy of the etching relative to the mask for such parts.

In the exemplary implementation of FIG. 9, barbed end 218 comprises an engaging face 218A that engages wall 208A of notch 208 when latched. Barbed end 216 and notch 206 have a like arrangement and operate in the same manner as described hereafter for barbed end 218 and notch 208. Extension member 204 comprises an end face 204A (which may be referred to as an engaging face in embodiments wherein extension member 204 engages microcomponent B). Microcomponent B comprises an opposing face 901, which opposes end face 204A of extension member 204. It should be understood from FIG. 9 that when extension member 204 is latched, engaging face 218A of barbed end 218 will engage wall 208A of notch 208 at a position 2*ETCH offset from the mask layout. That is, because both engaging face 218A and wall 208A are over-etched by the amount ETCH, they will engage each other when extension member 204 advances a distance 2*ETCH further toward microcomponent B than provided for in the mask layout. Thus, such an effect would result in extension member 204 advancing further toward microcomponent B than designed in the mask layout if the implementation were not over-etch insensitive. The example of FIG. 9 provides an implementation that is over-etch insensitive, as end face 204A and opposing face 901 are also over-etched by amount ETCH, thereby offsetting the distance 2*ETCH that extension member 204 moves toward microcomponent B. As shown in FIG. 9, end face 204A is over-etched by amount ETCH, and opposing surface 901 of microcomponent B is likewise over-etched by amount ETCH. Such over-etched features combine to provide an amount 2*ETCH, which offsets the 2*ETCH distance that extension member 204 travels due to the over-etching of engaging face 218A and wall 208A. Therefore, once extension member 204 is latched, it is consistently positioned relative to microcomponent B as was designed in the mask layout. That is, irrespective of whether such over-etching occurs, extension member 204 may be latched in a position having a consistent positional arrangement with microcomponent B. Accordingly, a desired amount of spacing (if any) between microcomponent B and extension member 204 is achieved when extension member 204 is latched, irrespective of inaccuracy in the etching process.

Described in another way, FIG. 9 shows a Y-axis having an origination point 0 at base 902 and advancing positively in the direction from such base 902 toward microcomponent B, while advancing negatively in the direction from such base 902 away from microcomponent B. In the example of FIG. 9, the fabrication process results in engaging face 218A being offset from the mask layout by a distance ETCH in the positive Y direction, i.e., by amount:

(Engaging_Face_Mask+ETCH).

The fabrication process results in wall 208A being offset from the mask layout by a distance ETCH in the negative Y direction, i.e., by amount:

(Wall_Mask−ETCH).

Therefore, engaging face 218A engages wall 208A at a location represented by:

(Engaging_Face_Mask+ETCH)−(Wall_Mask−ETCH), or 2*ETCH further than the mask layout.

Additionally, the fabrication process results in opposing face 901 of microcomponent B being offset from the mask layout by a distance ETCH in the positive Y direction, i.e., by amount:

(Opposing_Face_Mask+ETCH).

The fabrication process results in end face 204A of extension member 204 being offset from the mask layout by a distance ETCH in the negative Y direction, i.e., by amount:

(End_Face_Mask−ETCH).

Therefore, when extension member B is latched into place, the resulting distance between end face 204A of extension member 204 and opposing face 901 of microcomponent B is represented by:

(Opposing_Face_Mask+ETCH)−(End_Face_Mask−ETCH), or 2*ETCH further than the mask layout, thereby exactly compensating for the over-etching of engaging face 218A and wall 208A.

Therefore, the distance between end face 204A of extension member 204 and opposing face 901 of microcomponent B that results from latching extension member 204 into place can be accurately represented as:

(Opposing_Face_Mask−End_Face_Mask)−(Engaging_Face_Mask−Wall_Mask).

Accordingly, any over-etching or under-etching that may occur in the fabrication process is compensated within various embodiments, thereby allowing a desired positional relation between extension member 204 and microcomponent B to be consistently achieved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An assembly of microcomponents comprising:
a first microcomponent fabricated over a substrate;
a second microcomponent fabricated over the substrate; and
a separate extension member not anchored directly to the substrate, the extension member being movable relative to the substrate for reconfiguring between a first position and a second position, wherein:
when in the first position, the extension member is laterally positioned internal to the second microcomponent and is laterally movable relative to the second microcomponent; and
when in the second position, the extension member is engaged with the second microcomponent and extends beyond a perimeter of the second microcomponent to contact the first microcomponent.

2. The assembly of claim 1 wherein a separation distance is required between the first and second microcomponents during their fabrication.

3. The assembly of claim 1 wherein the extension member is movable relative to the substrate and the second microcomponent in a manner that requires no electrical power.

4. The assembly of claim 1 wherein said assembly comprises an assembly selected from the group consisting of:
a linear stepper, a rotational stepper, and a planetary bearing.

5. The assembly of claim 1 wherein one of the first and second microcomponents is totally released from the substrate.

6. The assembly of claim 5 wherein positional accuracy of the totally released one of the first and second microcomponents is maintained at least in part by the extension member when the extension member is in the second position.

7. The assembly of claim 1 wherein the extension member is configured to impart movement to at least one of the first and second microcomponents.

8. The assembly of claim 7 wherein the extension member is coupled to an actuator configured to generate movement of the extension member.

9. The assembly of claim 1 wherein the extension member includes a notch, and wherein the second microcomponent includes an arm having a barbed end configured to engage the notch.

10. The assembly of claim 9 wherein the arm is configured to outwardly deflect in response to movement of the extension member from the first position towards the second position, and wherein the arm is further configured such that the arm deflection relaxes in response to the engagement of the notch and the barbed end.

11. The assembly of claim 1 wherein the first and second microcomponents collectively comprise a latching mechanism to latch the extension member once it is extended to the second position.

12. The assembly of claim 11 wherein the latching mechanism comprises a notch and an engaging member arranged to engage the notch.

13. The assembly of claim 12 wherein the notch is included on the extension member, and wherein the engaging member extends from an arm that is integral to the extension member.

14. The assembly of claim 1 wherein the assembly is insensitive to etching inaccuracy encountered in a process utilized to fabricate the first and second microcomponents.

15. The assembly of claim 14 wherein said etching inaccuracy includes inaccuracy selected from the group consisting of: over-etching and under-etching.

16. The assembly of claim 14 wherein the extension part comprises features arranged such that the extension member compensates for the etching inaccuracy.

17. The assembly of claim 16 wherein the extension member compensates for the etching inaccuracy in a manner that results in the extension member being movably extendable to reduce as-fabricated separation space between the first and second microcomponents to provide separation distance consistent with separation distance that would be recognized if the etching inaccuracy were not present.

18. An apparatus, comprising:
a first microcomponent; and
a second microcomponent separated from the first microcomponent by a separation distance, wherein the separation distance is adjustable in response to a relative position of a first portion of the second microcomponent relative to a second portion of the second microcomponent, and wherein the first portion is completely released from a substrate on which the first and second microcomponents are fabricated.

19. The apparatus of claim 18 wherein the second portion of the second microcomponent is a stationary portion relative to the first microcomponent and the first portion of the second microcomponent is a movable portion relative to the stationary portion and the first microcomponent.

20. The apparatus of claim 18 wherein the first portion is movable between a plurality of positions relative to the second portion, and wherein the first and second portions are engaged in one of the plurality of positions.

21. The apparatus of claim 18 wherein the first portion is movable between a plurality of positions relative to the second portion, and wherein at least one of the first and second portions is configured to deflect in response to movement of the first portion towards at least one of the plurality of positions.

22. The apparatus of claim 18 wherein the first microcomponent is one of a plurality of first microcomponents and the second microcomponent is one of a plurality of second microcomponents each separated from a corresponding one of the plurality of first microcomponents by a corresponding one of a plurality of separation distances, wherein each of the plurality of separation distances is adjustable in response to orientation of a movable portion of a corresponding one of the plurality of second microcomponents relative to a stationary portion of the corresponding one of the plurality of second microcomponents.

23. The apparatus of claim 18 wherein a first one of the first and second microcomponents includes a barbed feature and a second one of the first and second microcomponents includes a notched feature, wherein the barbed and notched feature are configured to engage to substantially constrain relative movement of the first and second portions.

24. The apparatus of claim 18 wherein the first portion of the second microcomponent is configured to interface with a gripper interface that is configured to apply a motive force to the first portion for the orientation of the first portion.

25. The apparatus of claim 18 wherein the first portion of the second microcomponent is configured to interface with a tweezer interface that is configured to apply a motive force to the first portion for the orientation of the first portion.

26. The apparatus of claim 18 wherein the first portion of the second microcomponent is configured to interface with a probe interface that is configured to apply a motive force to the first portion for the orientation of the first portion.

27. The apparatus of claim 18 wherein the first portion of the second microcomponent includes an aperture configured to receive a device that is configured to thereby apply a motive force to the first portion for the orientation of the first portion, wherein the device is selected from the group consisting of a gripper device, a tweezer device, and a probe device.

28. The apparatus of claim 18 wherein the separation distance is a minimum distance between a first edge of the first microcomponent and a second edge of the second microcomponent, wherein at least a portion of a first profile of the first edge substantially conforms to at least a portion of a second profile of the second edge.

29. The apparatus of claim 28 wherein at least a portion of the first profile has a first tooth-edged configuration and at least a portion of the second profile has a second tooth-edged configuration corresponding to the first tooth-edged configuration.

30. The apparatus of claim 18 wherein at least a portion of at least one of the first and second microcomponents is a rotational gear.

31. The apparatus of claim 18 wherein at least a portion of at least a first one of the first and second microcomponents is a rotational gear that is selectively rotatable relative to a second one of the first and second microcomponents based on adjustment of the separation distance.

32. The apparatus of claim 18 wherein at least one of the first microcomponent, the first portion of the second microcomponent, and the second portion of the second microcomponent is positionally fixed relative to the substrate, such that the relative orientation of the first and second portions of the second microcomponent includes movement of at least one of the first and second portions relative to the substrate.

33. The apparatus of claim 18 wherein at least one of the first microcomponent, the first portion of the second microcomponent, and the second portion of the second microcomponent is positionally fixed relative to the substrate, such that the relative orientation of the first and second portions of the second microcomponent includes lateral movement of at least one of the first and second portions across the substrate.

34. The apparatus of claim 18 wherein a first one of the first and second portions of the second microcomponent is positionally fixed relative to the substrate via one of direct and indirect coupling to the substrate, and wherein a second one of the first and second portions of the second microcomponent is not directly coupled to the substrate but is positionally fixable relative to the substrate by selectable indirect coupling to the substrate via engagement between the first and second portions.

35. A micro-scale apparatus, comprising:
a first microcomponent fabricated over a substrate;
a second microcomponent fabricated over the substrate; and
a separate extension member not anchored directly to the substrate, the extension member being movable relative to the substrate for reconfiguring between a first position and a second position, wherein:
when in the first position, the extension member is laterally positioned internal to the second microcomponent and is laterally movable relative to the second microcomponent;

when in the second position, the extension member is engaged with the second microcomponent and extends beyond a perimeter of the second microcomponent to contact the first microcomponent;

a minimum separation distance exists between proximate edges of the first microcomponent and the extension member, wherein at least a portion of a first profile of the first microcomponent edge substantially conforms to at least a portion of a second profile of the extension member edge; and at least a portion of the first profile has a first tooth-edged configuration and at least a portion of the second profile has a second tooth-edged configuration configured for engagement with the first tooth-edged configuration.

36. The apparatus of claim 35 wherein the extension member is movable relative to the substrate and the second microcomponent in a manner that requires no electrical power.

37. The apparatus of claim 35 wherein neither of the first microcomponent and the extension member are coupled directly to the substrate.

* * * * *